(12) United States Patent
Zang et al.

(10) Patent No.: US 9,773,540 B2
(45) Date of Patent: Sep. 26, 2017

(54) SKYRMION BASED UNIVERSAL MEMORY OPERATED BY ELECTRIC CURRENT

(71) Applicant: THE JOHNS HOPKINS UNIVERSITY, Baltimore, MD (US)

(72) Inventors: Jiadong Zang, New Market, NH (US); Chia-Ling Chien, Cockeysville, MD (US); Yufan Li, Baltimore, MD (US); Roger K. Lake, Riverside, CA (US); Gen Yin, Riverside, CA (US)

(73) Assignee: THE JOHNS HOPKINS UNIVERSITY, Baltimore, MD (US)

( * ) Notice: Subject to any disclaimer, the term of this patent is extended or adjusted under 35 U.S.C. 154(b) by 0 days.

(21) Appl. No.: 15/213,019

(22) Filed: Jul. 18, 2016

(65) Prior Publication Data

US 2017/0018297 A1    Jan. 19, 2017

Related U.S. Application Data

(60) Provisional application No. 62/193,752, filed on Jul. 17, 2015.

(51) Int. Cl.
| | | |
|---|---|---|
| G11C 11/00 | (2006.01) | |
| G11C 11/16 | (2006.01) | |
| H01L 43/08 | (2006.01) | |
| H01L 43/10 | (2006.01) | |
| H01L 43/12 | (2006.01) | |
| H01L 43/00 | (2006.01) | |
| H01L 27/22 | (2006.01) | |
| G11C 19/08 | (2006.01) | |

(52) U.S. Cl.
CPC ........ *G11C 11/1675* (2013.01); *G11C 11/161* (2013.01); *G11C 11/1673* (2013.01); *H01L 27/222* (2013.01); *H01L 43/00* (2013.01); *H01L 43/08* (2013.01); *H01L 43/10* (2013.01); *H01L 43/12* (2013.01); *G11C 19/08* (2013.01)

(58) Field of Classification Search
CPC . G11C 11/1675; G11C 11/1673; H01L 43/08; H01L 43/10; H01L 43/12
See application file for complete search history.

(56) References Cited

U.S. PATENT DOCUMENTS

| | | | | |
|---|---|---|---|---|
| 2011/0261602 | A1* | 10/2011 | Moutafis | ................ B82Y 10/00 365/8 |
| 2013/0294131 | A1* | 11/2013 | Moutafis | ................ B82Y 10/00 365/8 |
| 2015/0235799 | A1* | 8/2015 | Jozwiak | ............ H01L 29/66007 313/533 |
| 2016/0314827 | A1* | 10/2016 | Cros | ........................ G11C 11/16 |
| 2017/0033742 | A1* | 2/2017 | Akerman | ............. H03B 15/006 |

OTHER PUBLICATIONS

R. Tomasello et al.; "A Strategy for the Design of Skyrmion Racetrack Memories"; Scientific Reports; 4: 6784; DOI: 10.1038/srep06784; Published Oct. 29, 2014; 7 pgs.

* cited by examiner

*Primary Examiner* — Pho M Luu
(74) *Attorney, Agent, or Firm* — MH2 Technology Law Group LLP

(57) ABSTRACT

A method for generating a skyrmion, comprising: depositing a vertical metallic nanopillar electrode on a first side of a helimagnetic thin film, the helimagnetic thin film having a contact on a second side to provide a current drain; injecting a current through the vertical metallic nanopillar electrode to generate a rotating field; and applying a static upward magnetic field perpendicular to the helimagnetic thin film to maintain an FM phase background.

18 Claims, 27 Drawing Sheets

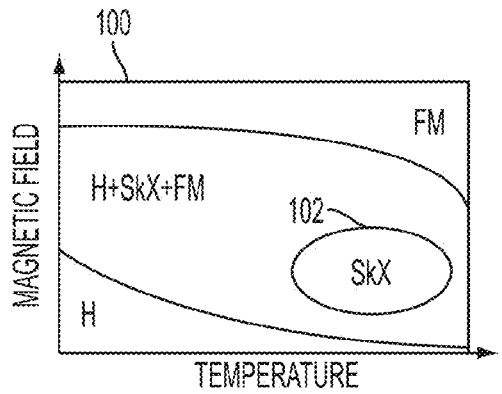
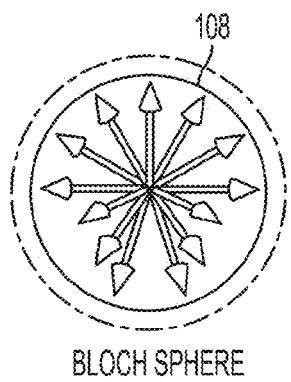
FIG. 1A
FIG. 1B
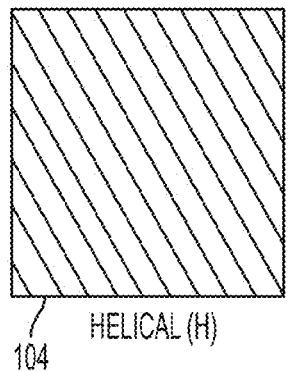
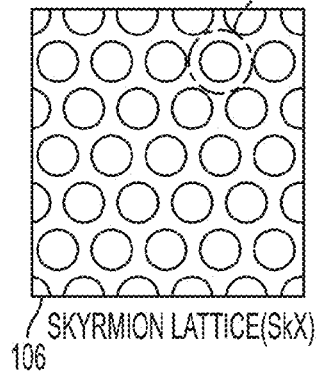
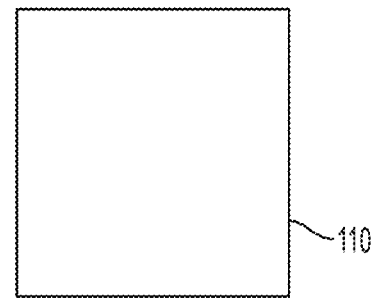
FIG. 1C
FIG. 1D
FIG. 1E

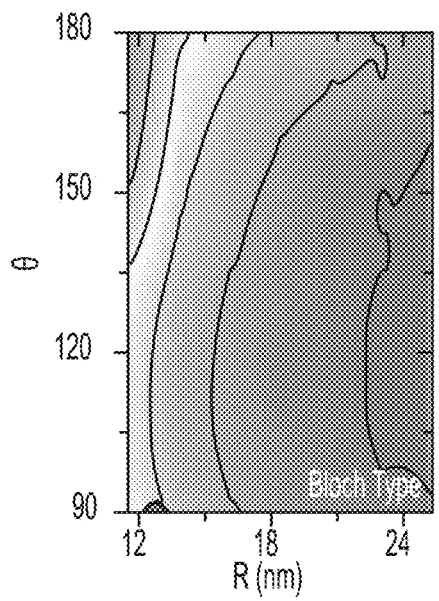
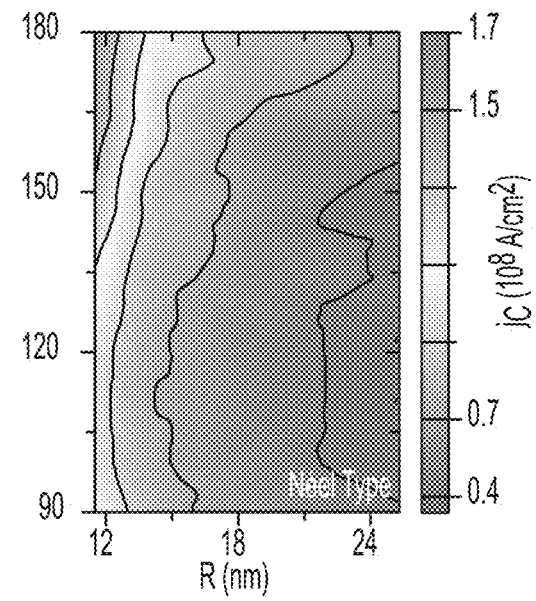
FIG. 20A   FIG. 20B
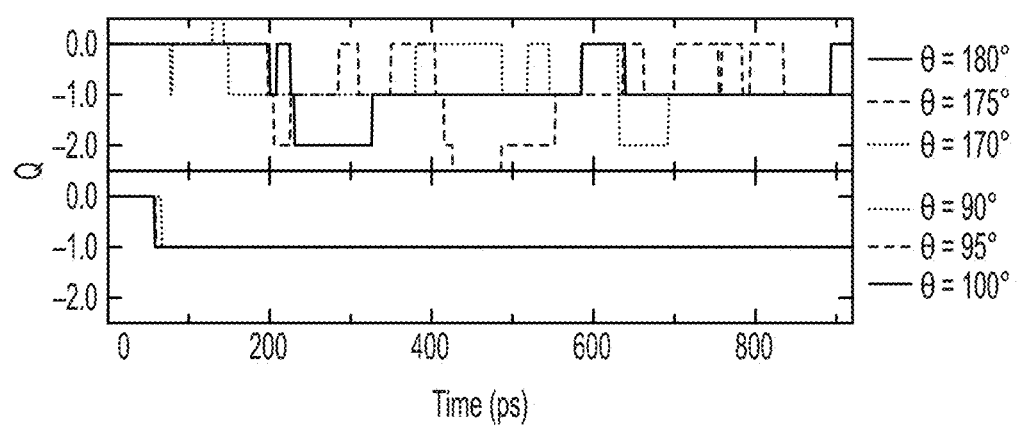
FIG. 20C

SKYRMION BASED UNIVERSAL MEMORY OPERATED BY ELECTRIC CURRENT

CROSS-REFERENCE TO RELATED APPLICATIONS

This application claims priority to U.S. Provisional Patent Application Ser. No. 62/193,752, filed Jul. 17, 2015, the entirely of which is incorporated herein by reference.

STATEMENT REGARDING FEDERALLY SPONSORED RESEARCH

This invention was made with government support under Grant Nos. 1128304 awarded by the National Science Foundation, and DEFG02-08ER46544 awarded by the Department of Energy. The government has certain rights in the invention.

FIELD

The present disclosure relates generally to methods and systems for creating and/or annihilating skyrmions for use in a data memory.

BACKGROUND

Magnetic skyrmions are topologically protected spin textures in which the local moments on a two dimensional lattice point in all directions with a topologically nontrivial mapping to the unit sphere. Physically, each skyrmion is a circular spin texture in which the spins on the periphery are polarized vertically, the central spin is polarized in the opposite direction, and, in between, the spins smoothly transition between the two opposite polarizations. A swirling transition, which is effectively a circle of double Bloch-type domain wall, gives a Bloch-type skyrmion. This type of skyrmion was first discovered in the temperature-magnetic field (T-H) phase diagram of B20 magnets. In these materials, the atomic structure of the lattice breaks the inversion symmetry, inducing an asymmetric Dzyaloshinsky-Moriya (DM) exchange interaction. The competition between the DM exchange and the symmetric Heisenberg exchange stabilizes the skyrmion phase in these materials. A Néel-type skyrmion, on the other hand, is a wrapped double Néel-wall. Such a skyrmion is stabilized by an interfacial DM interaction, which is originated from the broken interfacial inversion symmetry. This type of DM interaction is usually observed at the interface between a magnetic thin film and a layer of heavy metal with strong spin-orbit coupling (SOC). For both types of skyrmions, the radius, ranging from about 3 nm to 100 nm, is determined by the ratio of the strengths of the DM interaction and the Heisenberg interaction. Skyrmion lattices and isolated skyrmions in both bulk and thin films have been observed by neutron scattering, Lorentz transmission electron microscopy, and spin-resolved scanning tunneling microscopy (STM). Current can drive skyrmion spin textures with a current density 4-5 orders of magnitude lower than that required to move conventional magnetic domain walls. This suggests promising spintronic applications exploiting the topological spin texture as the state variable. A two-dimensional skyrmion lattice may be formed under a uniform magnetic field, however, the switching of isolated, individual skyrmions is far more challenging. The single skyrmion switching was first experimentally demonstrated by injecting spin-polarized current from an STM tip into ultra-thin Pd/Fe/Ir(111) films of about several atomic layers (between about 1-2 nm) at 4.2 K schemes of single skyrmion switchings, such as using a sharp notch, a circulating current, thermal excitations and spin-orbit torques (SOTs) have been proposed. Spintronic applications call for on-wafer solutions to precisely control the position and the time of skyrmion switchings with good reliability. This is rather difficult because each switching event corresponds to a topological transition, which has to break the protection given by the topological order. This process has to overcome the topological protection barrier, which is both energetically unfavorable and difficult to manipulate.

Magnetic skyrmions are topologically protected, particle-like spin textures. They can generally range in size from 1 nm to approximately 100 nm depending on material parameters. Further, skyrmions can generally be created and annihilated by spin currents and magnetic fields. Skyrmions can also generally be moved by an electrical current.

In many materials, skyrmions can be the middle phase of a progression of three phases with increasing magnetic fields: helical, skyrmions, and ferromagnetic. Due to the small size of skyrmions, their stability, the demonstration of their individual creation and annihilation, and their facile movement by low currents, skyrmions can potentially be used for application such as information storage (memory).

SUMMARY

The present disclosure provides novel methods and devices for creating and annihilating skyrmions for use in information storage.

In examples of the present disclosure, a method for creating a skyrmion, is provided. The method comprises providing a current through an electrode on a top surface of a helimagnetic material, wherein the current creates the skyrmion on the top surface.

In examples of the present disclosure, a method for generating a skyrmion is provided. The method comprising: depositing a vertical metallic nanopillar electrode on a first side of a helimagnetic thin film, the helimagnetic thin film having a contact on a second side to provide a current drain; injecting a current through the vertical metallic nanopillar electrode to generate a rotating field; and applying a static upward magnetic field perpendicular to the helimagnetic chin film to maintain an FM phase background.

In accordance with examples of the present disclosure, a method for creating a skyrmion is provided. The method comprises providing a current to a nanopillar electrode or point contact to generate a current, either spin polarized or unpolarized, onto a top surface of a helimagnetic material, wherein the current creates the skyrmion on the surface.

In some examples, the current density for skyrmion creation/annihilation is about $10^6$ to about $10^8$ A/cm$^2$. In some examples, the current density used to move the skyrmion is about 0.2 A/cm$^2$.

In some examples, the skyrmion is stabilized by applying a static upward magnetic field perpendicular to the helimagnetic thin film to maintain a ferromagnetic (FM) phase background. In some examples, the top layer of the nanopillar is comprised of ferromagnetic (FM) metals such as YiG and alloys such as CoFeB, Co, Fe, CoPt, FePt, FeFd, CoPd, or any combination thereof. In some examples, the skyrmion is annihilated by reversing a direction that the current is applied. In some examples, the helimagnetic material is composed of a material selected from FeGe, MnSi, MnGe, Fe$_{1-x}$Co$_x$Si, CoZnMn, Mn$_2$YZ Heusler alloy, (FeCoRh)$_2$Mo$_3$N, Fe/Ir film, Ta/CoFeB, Pt/Co/Ta, Pt/W/

CoFeB, Pt/Ta/CoFeB and Ir/Co/Pt. In some examples, the current is injected at a temperature below the Curie temperature of the helimagnetic material. In some examples, the current is injected using a point-contact directly touches the helimagnetic surface. In some examples, the skyrmion represents computer-readable data in a magnetic memory structure. In some examples, the helimagnetic material is about 1-3 nm in thickness.

In some examples, the method can further comprise depositing the nanopillar electrode on top surface of the helimagnetic material, the helimagnetic material having a contact on a bottom surface or a side surface to provide a current drain.

In some examples, the method can further comprise forming a spacer layer over the top surface of the helimagnetic material to provide enhanced electrical properties for the current In some examples, the spacer layer comprises an electrically conductive material and can be selected from non-magnetic materials such as copper, silver, or gold, with the thickness (about 5-nm or thicker) sufficient for magnetically decouple the top FM metal layer of the nanopillar and the helimagnetic material.

In accordance with examples of the present disclosure, a method of writing data to a magnetic memory structure is provided. The method comprises creating of a skyrmion by injecting a first current through a metallic nanopillar electrode, wherein the current, either spin polarized or unpolarized, creates rotating magnetic field on a first side of a helimagnetic material, the helimagnetic material having a contact on a second side to provide a current drain, wherein the skyrmion represents a computer-readable data; and applying a static upward magnetic field perpendicular to the helimagnetic material to maintain a ferromagnetic (FM) phase background to stabilize the skyrmion.

In some examples, the magnetic memory structure comprises a race track memory structure., a nanomesh memory structure, or a spin wave memory, In some examples, the skyrmion is annihilated by reversing a direction that the current is applied. In some examples, the helimagnetic material is composed of a material selected from FeGe, MnSi, MnGe, $Fe_{1-x}Co_xSi$, CoZnMn, $Mn_2YZ$ Heuster alloy, $(FeCoRh)_2Mo_3N$, Fe/Ir film, Ta/CoFeB, Pt/Co/Ta, Pt/W/CoFeB, Pt/Ta/CoFeB and Ir/Co/Pt. In some examples, the first, current is injected at a temperature below the Curie temperature of the helimagnetic material In some examples, the current is injected using a point contact directly touches the helimagnetic surface. In some examples, the helimagnetic material is about 1-3 nm in thickness.

In some examples, the method can further comprise applying a second current to move the skyrmion in the magnetic memory structure.

In accordance with examples of the present disclosure, a method for creating a skyrmion is provided. The method comprises providing a helimagnetic material comprising a top surface and a bottom surface, the bottom surface including an electrical contact to provide a current drain; providing a nanopillar electrode disposed on the top-surface of the helimagnetic material; and applying a current to the nanopillar electrode to generate a spin polarized current onto the top surface of a helimagnetic material, wherein the spin polarized or unpolarized current creates the skyrmion on the surface.

In accordance with examples of the present disclosure, a method for reading a skyrmion in a memory device is provided. The method comprises sending a current, smaller than the current for skyrmion creation, through the nanopillar or point contact; reading the skyrmion by a change of the magnetoresistance; and sending a spin wave through the cross bar, wherein the presence of skyrmion modifies the scattering matrix of spin waves. The magneto resistance is the vertical resistance as measured between the nanopillar or point contact and a back electrode. The cross bar can be a nanomesh structure. The spin wave is the high energy excitation above the magnetic ground state, or in other words, it is the spin deviation from its equilibrium direction. The spin wave carries Information, just like spin, and propagates without Joule heating. The change of the transition rate of the spin wave reflects the presence or absence of the skyrmion. The cross bar is comprised of ferromagnetic (FM) metals such as YiG and alloys such as CoFeB, Co, Fe, CoPt, FePt, FePd, CoPd, or any combination thereof.

The foregoing and other examples and advantages of the disclosure will appear from the following description, in the description, reference is made to the accompanying drawings which form a part hereof, and in which there is shown by way of illustration an example of the disclosure. Such example does not necessarily represent the full scope of the disclosure, however, and reference is made therefore to the claims and herein for interpreting the scope of the disclosure.

BRIEF DESCRIPTION OP THE DRAWINGS

The accompanying drawings, which are incorporated in and constitute a part of this specification, illustrate embodiments of the disclosure and together with the description, serve to explain the principles of the disclosure. In the figures:

FIGS. 1A-1E are phase diagrams illustrating magnetic fields, where FIG. 1A shows a phase diagram 100 of a helimagnet, FIG. 1B shows an individual skyrmion crystal, such as a Bloch sphere 108 that illustrates the spins of a skyrmion, FIG. 1C shows the helical phase in diagram 104. FIG. 1D shows a diagram 106 of a skyrmion lattice, and FIG. 1E shows a diagram 110 of the ferromagnetic phase, according to examples of the present disclosure.

FIGS. 6A-6F illustrate a single Bloch-type skyrmion creation due to an Oersted field Induced by spin unpolarized current where 6A illustrates the swirling texture before the creation of a skyrmion. 68 illustrates the spin texture after a topological charge of −1 is created, 6C illustrates the real-space spin configuration at the center of the swirling texture, immediately before the creation moment, 6D illustrates the spin configuration in spin space, 6E illustrates the trajectory of $S_0$ during the creation process where the closed loop $S_AS_BS_CS_D$ illustrates the boundary of the topological transition, and 6F illustrates the critical current density, $j_C$, at different values of the electrode radius, according to examples of the present disclosure.

Figure 7:
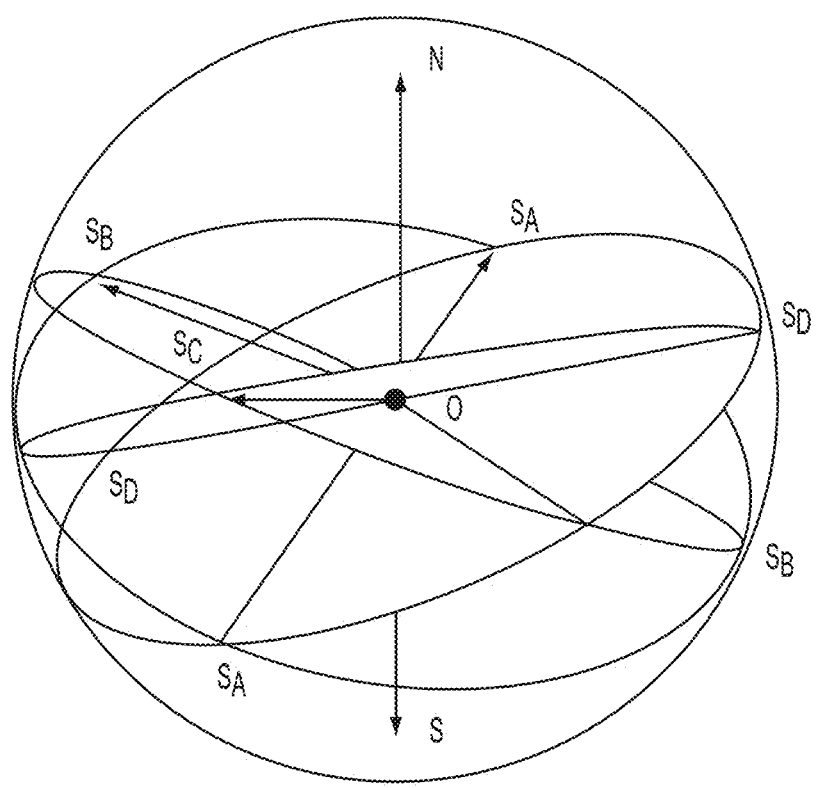

FIG. 7 illustrates a $S_O$, $S_A$, $S_B$, $S_C$, and $S_D$ in a unit sphere.

Figure 8:
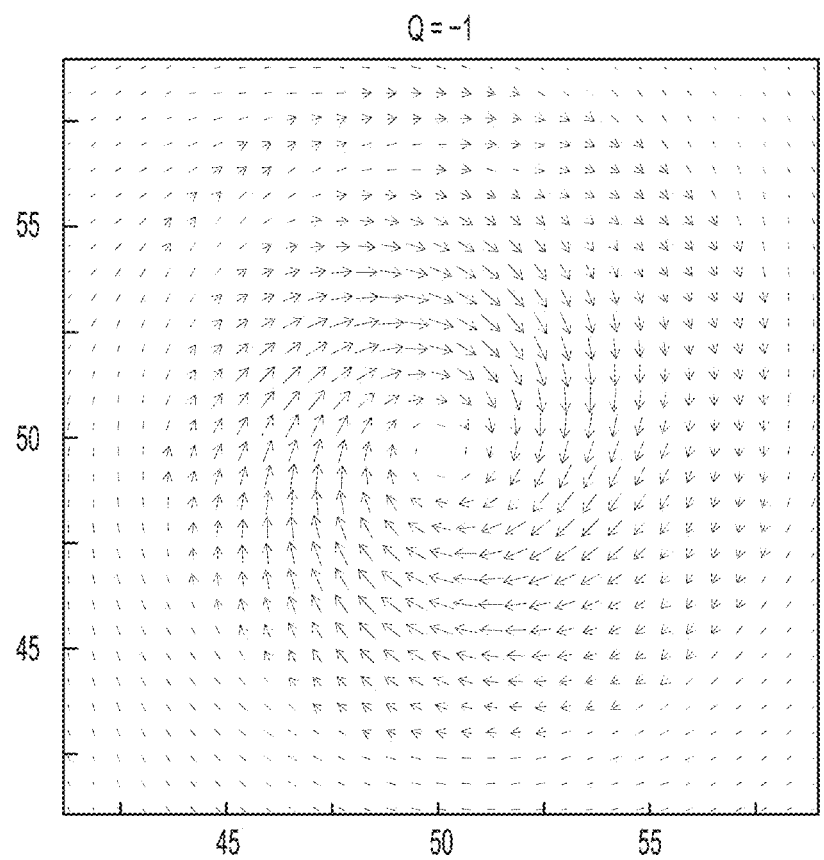

FIG. 8 illustrates a snapshot taken after a topological transition of a skyrmion creation process, according to examples of the present disclosure.

Figure 9:
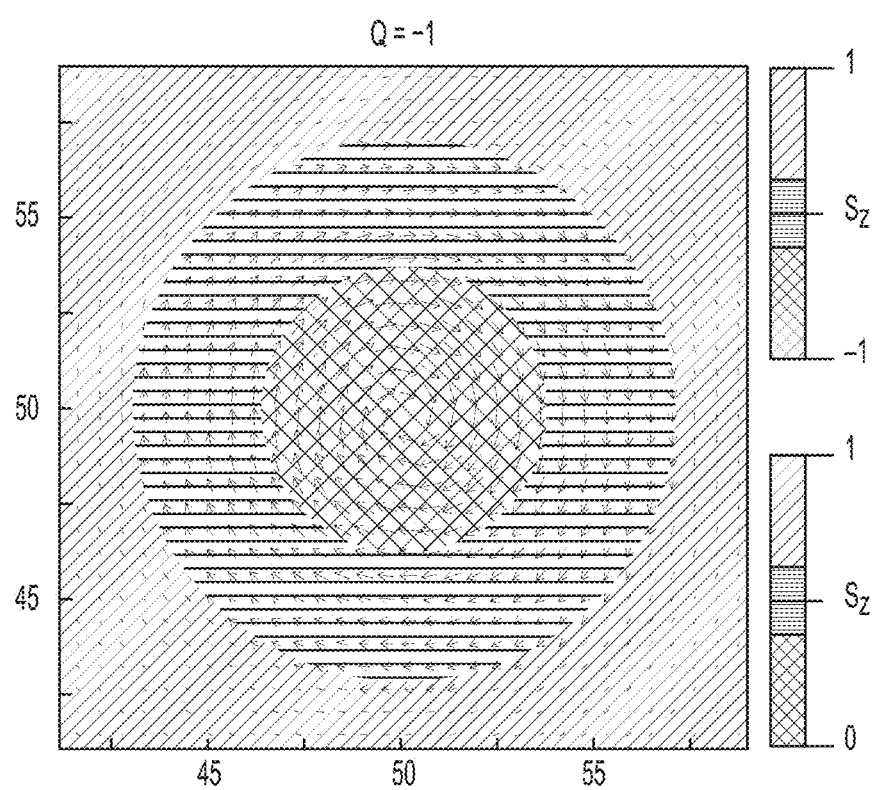

FIG. 9 illustrates a created skyrmion on a ferromagnetic background after a magnetic stimuli is removed, according to examples of the present disclosure.

Figure 10:
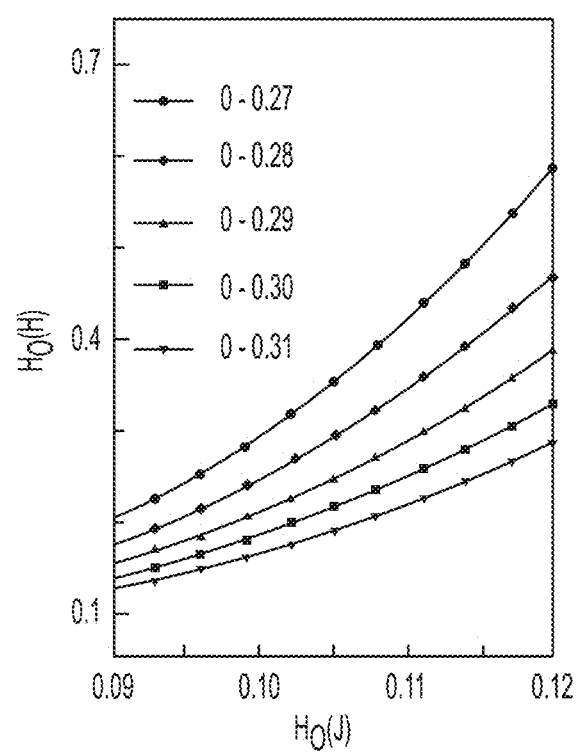

FIG. 10 illustrates a $H_0$ variation with the change of the background field $H_0$ and the DM interaction, D, according to examples of the present disclosure.

Figure 11:
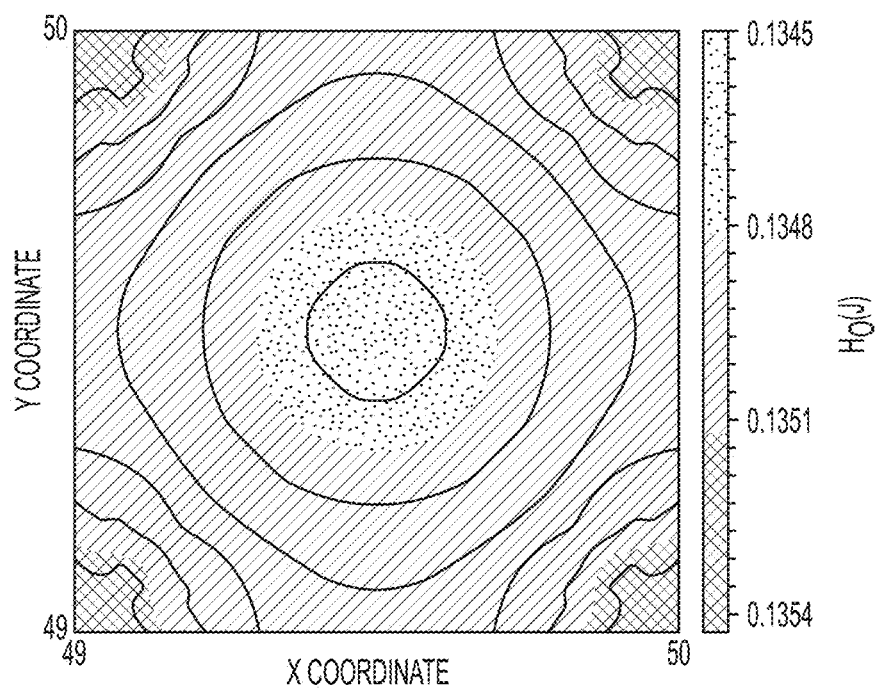

FIG. 11 illustrates a scan of an electrode center on a central plaquette at zero temperature, according to examples of the present disclosure.

Figure 12:
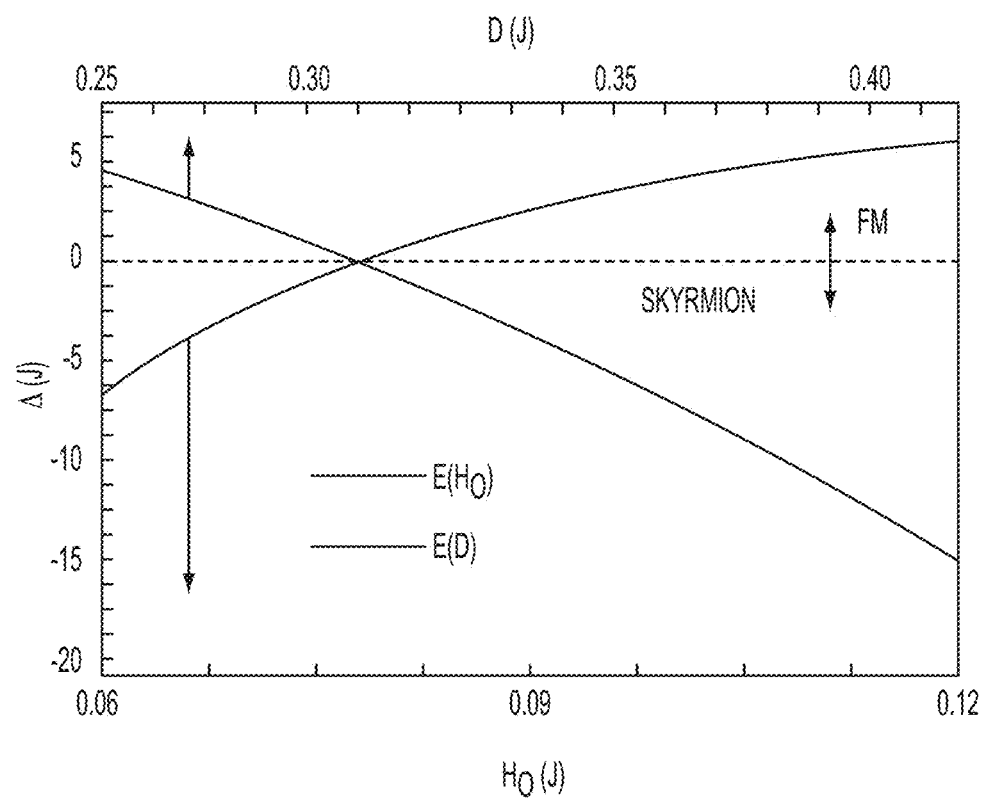

FIG. 12 illustrates a dependence of $\Delta$ on $H_0$ and D, according to examples of the present disclosure.

Figure 13:
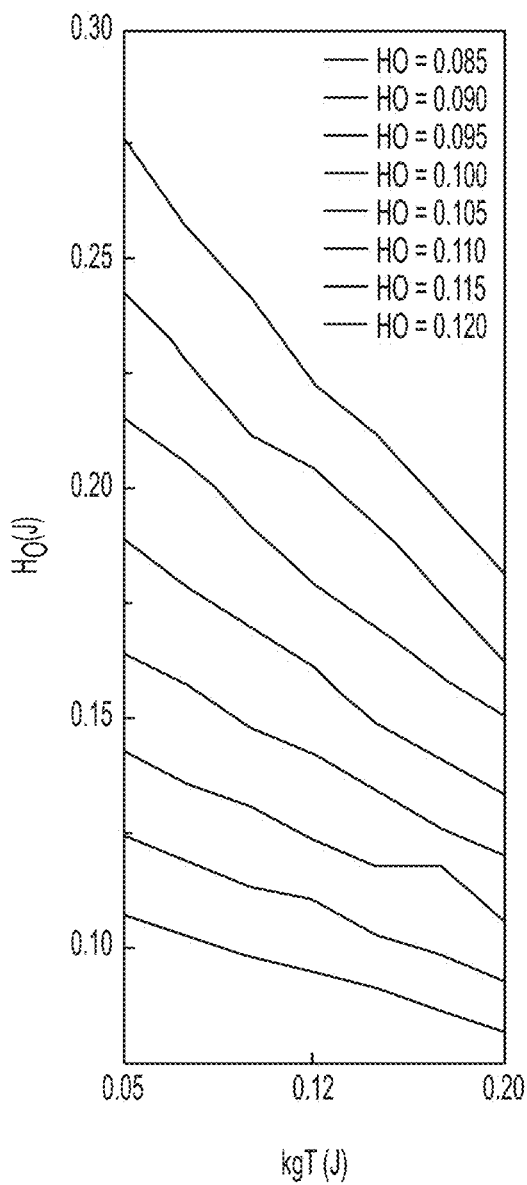

FIG. 13 illustrates a temperature assisted skyrmion creation, according to examples of the present disclosure.

Figure 14:
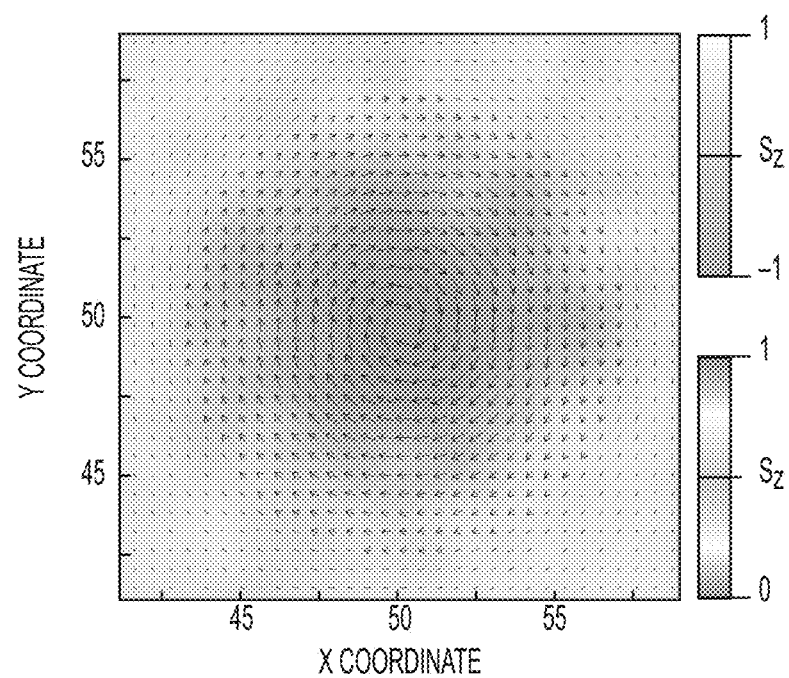

FIG. 14 illustrates a snapshot of a stable skyrmion created on an FM background, according to examples of the present disclosure.

Figure 15:
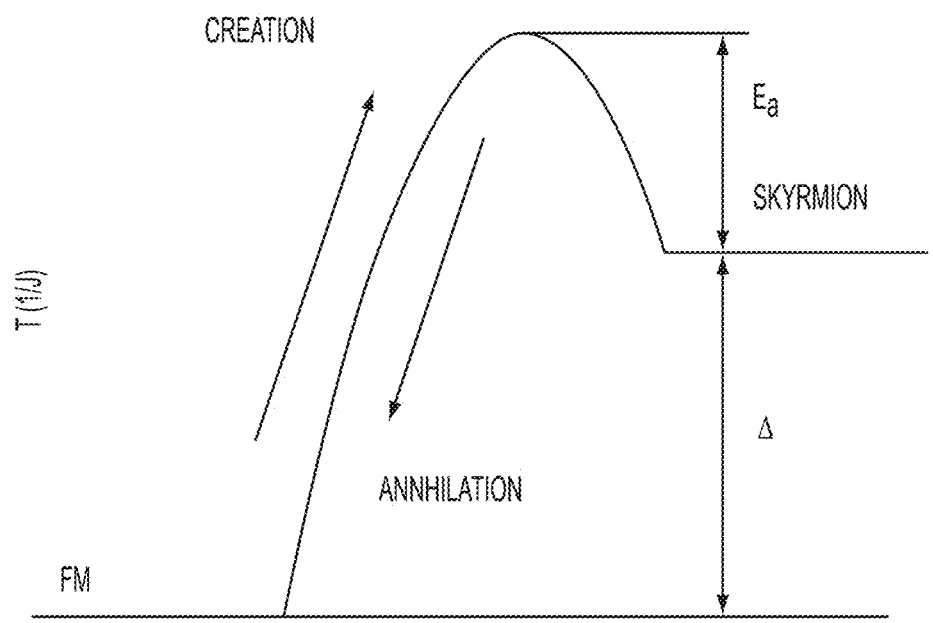

FIG. 15 illustrates a schematic plot of the energy barrier of the skyrmion-FM local phase change, according to examples of the present disclosure.

Figure 16:
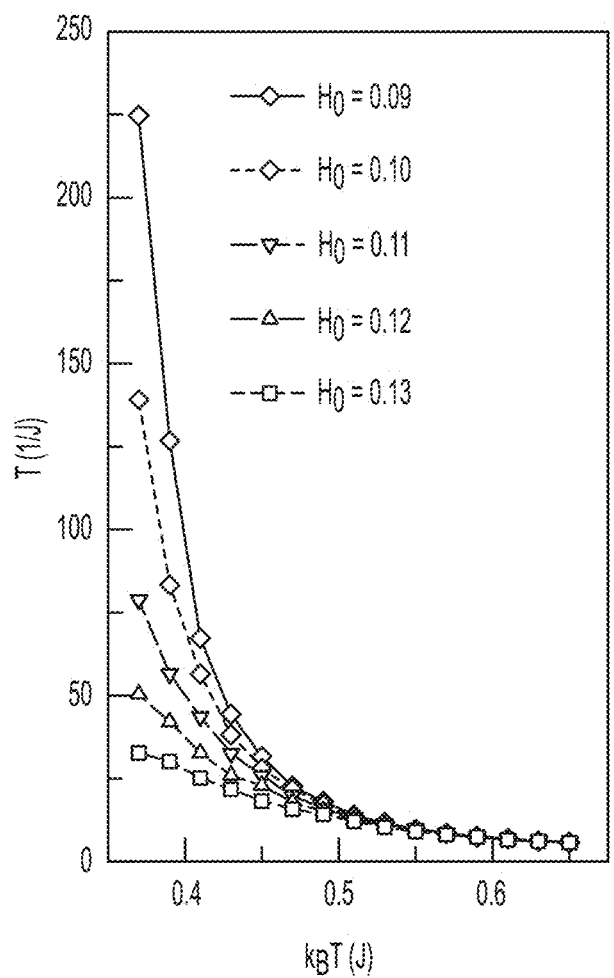

FIG. 16 illustrates a single life time at a finite temperature, according to examples of the present disclosure.

Figure 17:
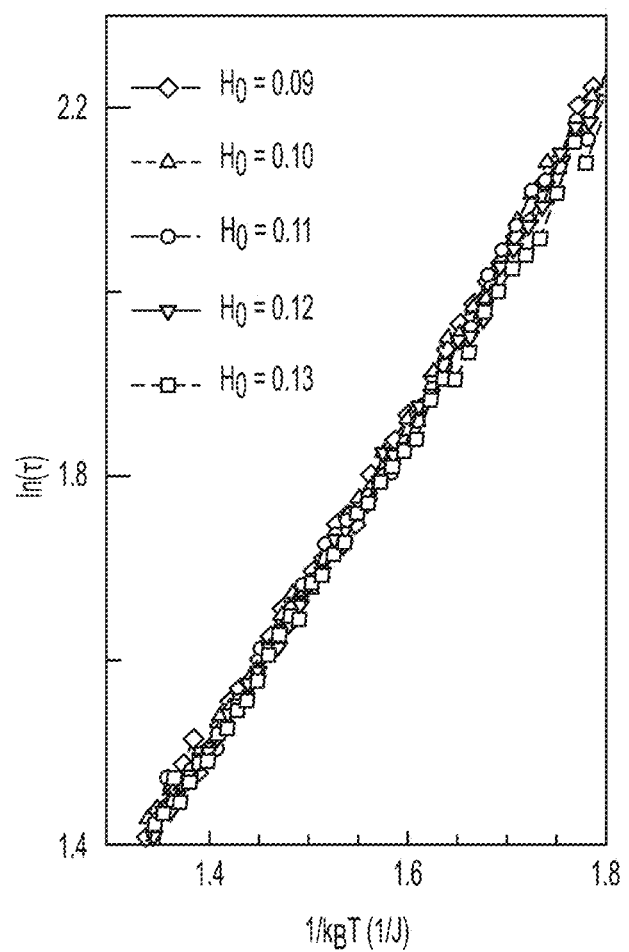

FIG. 17 illustrates a sampling comparing $\ln\tau$ vs. $1/k_BT$ for different $H_0$ values, according examples of the present disclosure.

Figure 18:
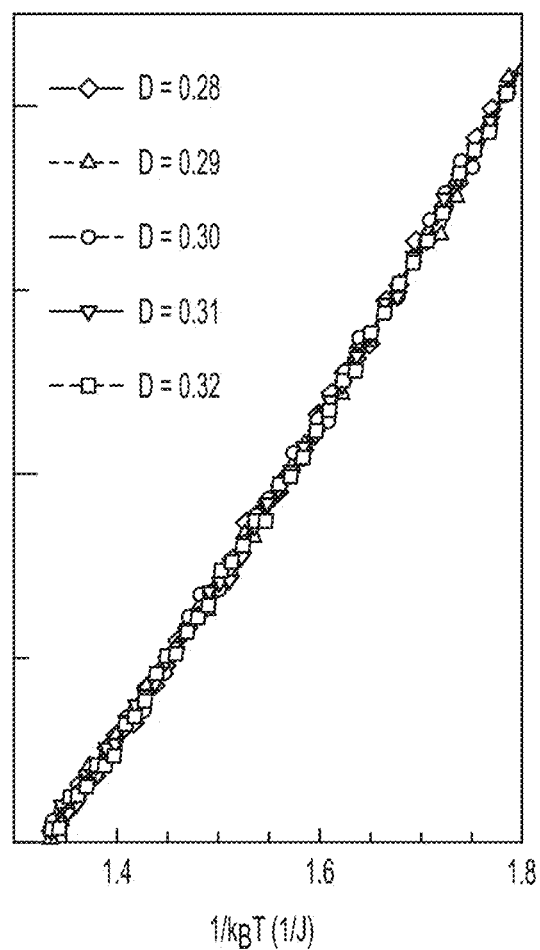

FIG. 18 illustrates a sampling comparing $\ln\tau$ vs. $1/k_BT$ for different D values, according to examples of the present disclosure.

FIGS. 19A-19D illustrate snap shots where 19A, 19B, and 19C are snap shots of the spin texture several picoseconds around the moment of the topological transition in a Bloch-type helimagnetic thin film, 19D demonstrates the spin trajectories of the local topological transition, where the arrows 1905 and 1910 denote the configurations before and after the transition, respectively, and a coplanar and non-colinear configuration is achieved exactly at the moment of the skyrmion creation (arrows 1915), according to examples of the present disclosure.

FIGS. 20A-20C illustrate the phase diagram of $j_C$ for the Bloch-type in 20A and the Néel-type skyrmions in 20B, and 29C illustrates the time evolution of the topological charge at several different polarization angles In the case of Bloch-type skyrmions, according to examples of the present disclosure.

Figure 21A:
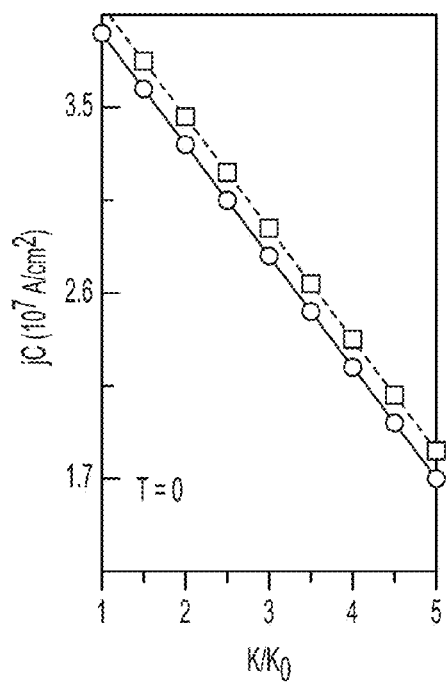

FIG. 21(a) illustrates the reduction of $j_C$ at different values of K and 21(b) illustrates the heat assisted skyrmion creation at finite temperatures where each point is an average over 400 different sampling runs, according to examples of the present disclosure.

Figure 19A:
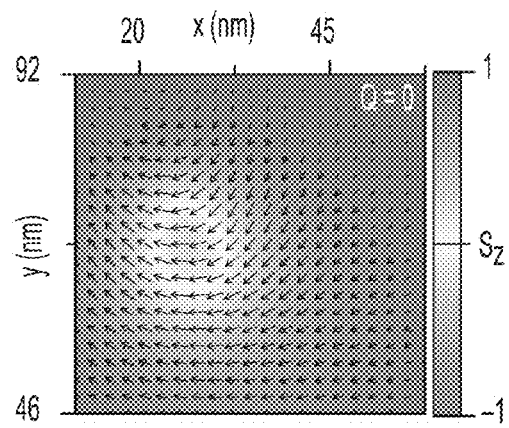
Figure 19B:
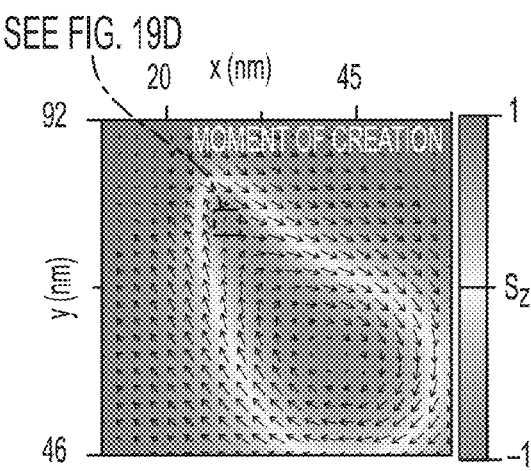
Figure 19C:
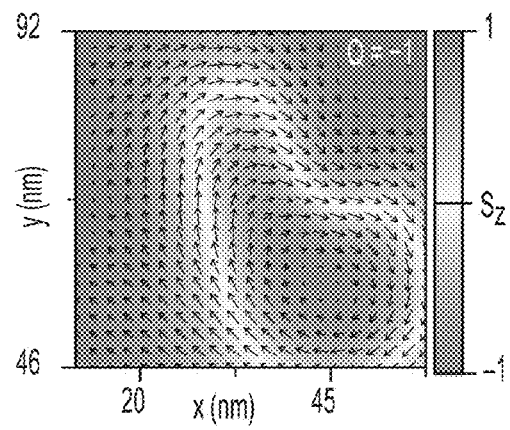
Figure 19D:
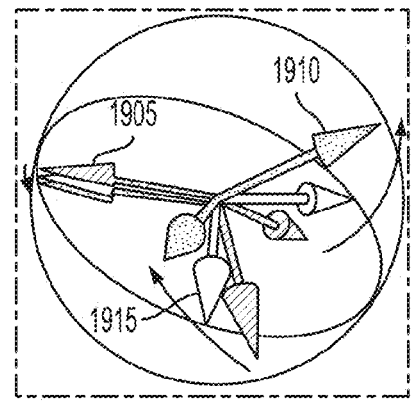

FIGS. 22A-22E illustrate the energy landscape of the topological transition where 22A, 22B and 22C illustrate the energy density distribution of a Bloch-type skyrmion creation process where these plots correspond to the snap shots given in FIGS. 19B, 19C and 19D, the time evolution of the maximum energy density for both types of skyrmions is plotted in 22D, and 22E illustrates the critical spin configuration when a Néel-type skyrmion is created, according to examples of the present disclosure.

Figure 23C:
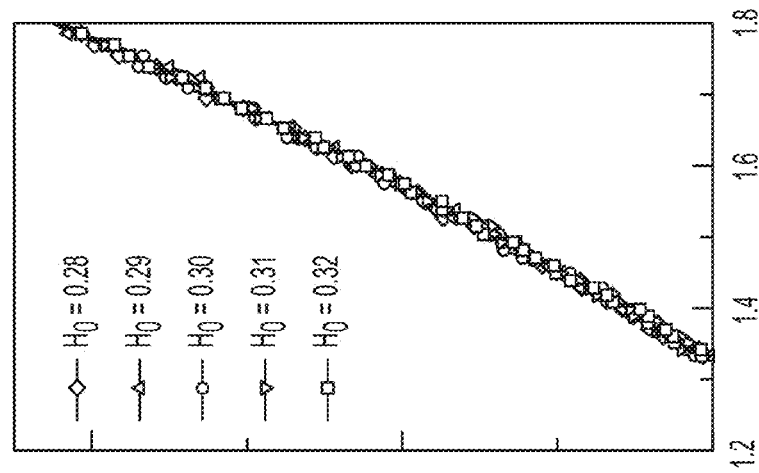
Figure 23B:
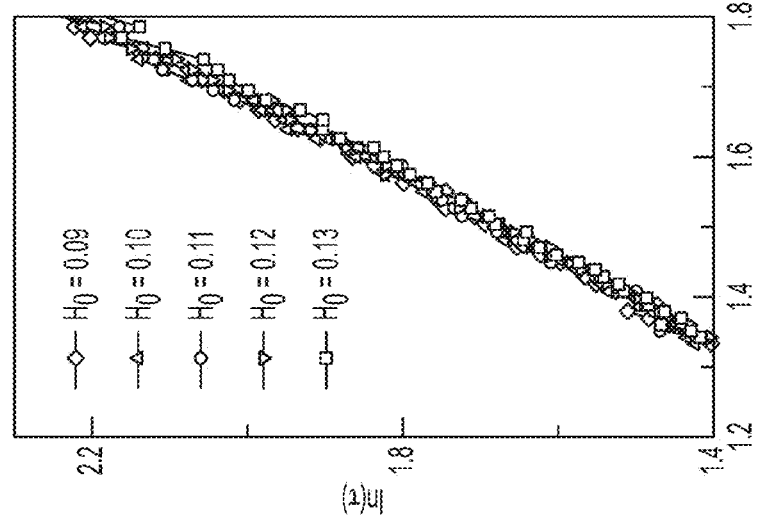
Figure 23A:
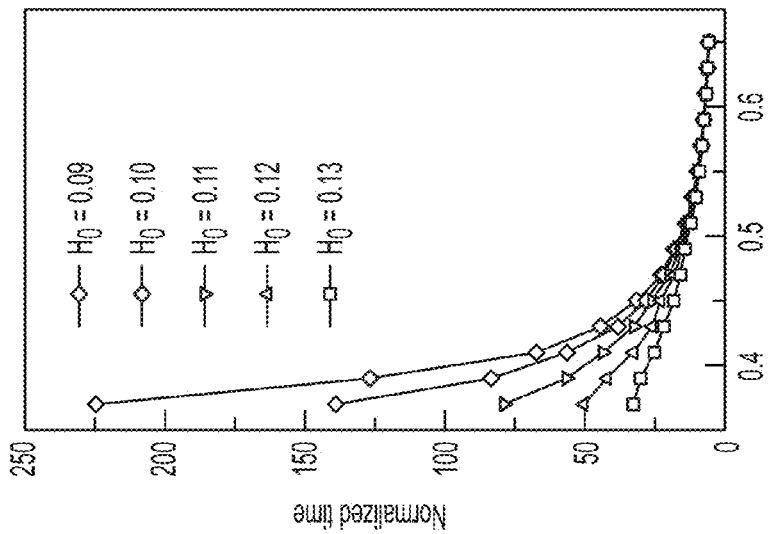

FIGS. 23A-23C illustrate average life time of a topological charge induced by thermal fluctuations where 23A illustrates a single skyrmion life time at finite temperature (D=0.3 J, $\alpha$=0.1) where each point is an average of 1000 sampling runs, 23B-23C illustrates of plot of $\ln(\tau)$ vs. $1/k_BT$ at different $H_0$ and D where the slope of the linear fit gives a numerical estimation of $E_a$~1.7 J, according to examples of the present disclosure.

Figure 24:
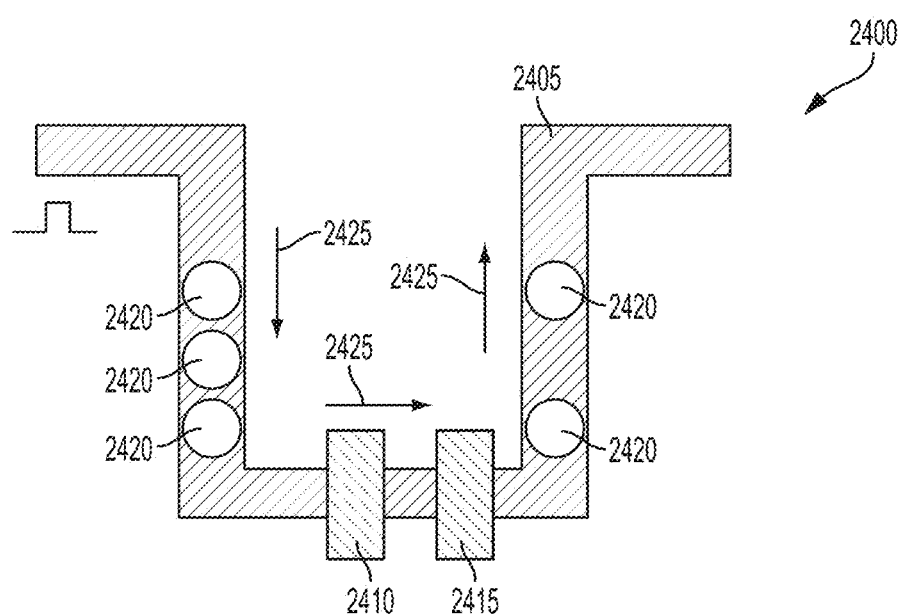

FIG. 24 illustrates a racetrack memory architecture, according to examples of the present disclosure.

Figure 25A:
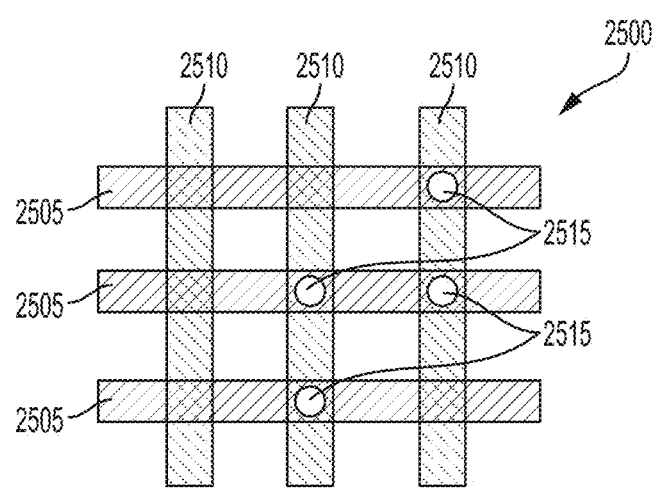
Figure 25B:
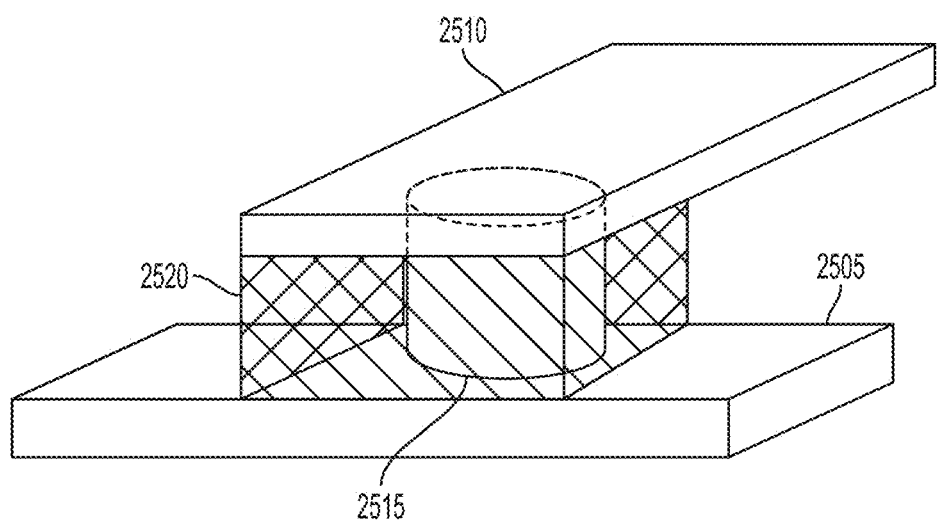

FIGS. 25a and 25b illustrates a top view and perspective view of a nanomesh memory architecture, respectively, according to examples of the present disclosure.

Figure 26:
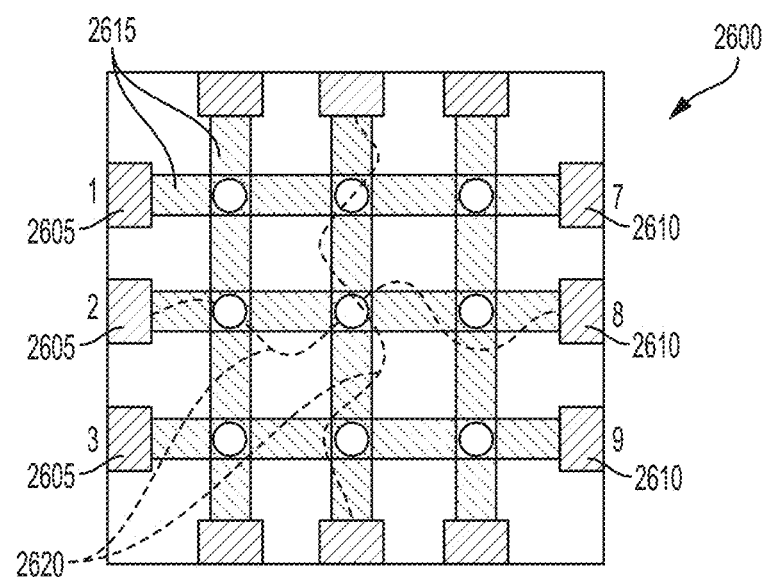

FIG. 26 illustrates spin wave memory array, according to examples of the present disclosure.

DETAILED DESCRIPTION

Reference will now be made in detail to examples of the present disclosure, examples of which are illustrated in the accompanying drawings. Wherever convenient, the same reference numbers will be used throughout the drawings to refer to the same or like parts.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5, In certain cases, the numerical values as stated for the parameter can take on negative values, in this case, the example value of range stated as "less than 10" can assume negative values, e.g. −1, −2, −3, −10, −20, −30, etc.

As used herein, the terra "magnetic skyrmion" or "skyrmion" refers to topologically non-trivial spin textures with integer topological charges that occur in helimagnetic materials in which broken inversion symmetry can give rise to the Dzyaloshinskii-Moriya (DM) interaction.

Skyrmions have been proposed for applications in future information storage devices because of their small size, their stability, and their facile movement with low current. For such purposes, the ability to create single skyrmions is required, and an understanding of the process of skyrmions can he created with nanosecond unpolarized current pulses by exploiting the magnetic interactions inherent to skyrmions.

Skyrmions are generally the middle phase of a progression of three phases with increasing magnetic fields. Specifically, the phases can be, from lowest to highest magnetic fields, helical, skyrmion, and ferromagnetic. FIGS. 1A-1E illustrate the three phases in graphical detail. FIG. 1A shows a phase diagram 100 of a helimagnet. The skyrmion crystal 102 can occur at finite temperature and moderate magnetic fields as shown in FIG. 1. FIG. 1C shows the helical phase in diagram 104. FIG. 1B shows a diagram 106 of a skyrmion lattice. An individual skyrmion crystal such as a Bloch sphere 108 in FIG. 1B illustrates the spins of a skyrmion. Finally, the ferromagnetic phase can be seen in diagram 110 of FIG. 1E.

Skyrmion Creation

Skyrmions can, in one example, be created with nanosecond unpolarized current pulses which can exploit the magnetic interactions inherent to skyrmions. A lattice version of a topological charge is showed herein which can provide a clear picture of spin trajectories and orientations that can locally trigger a topological transition. This lattice version can further reveal the topological origins of a Skyrmion's stability at finite temperatures.

Magnetic skyrmions can have topologically protected spin textures in which the local moments on a two dimensional lattice point in all directions with a topologically non-trivial mapping to a unit sphere. A skyrmion can have extra topological stability as a stable state in the temperature-magnetic field (T-H phase diagram of certain helimagnetic materials, most notably, B20 magnets. In such skyrmion-hosting materials, the breaking of the inversion symmetry can give rise to the asymmetric Dzyaloshinskii-Moriya (DM) interaction. The skyrmion can arise from the competition between the DM interaction and the symmetric Heisenberg interaction. Indeed, the skyrmion radius, which can range from about 3 nm to 100 nm, can be determined by the ratio of the strengths of these two interactions. The skyrmion lattice and isolated skyrmions have been observed in both bulk and thin film specimens by neutron scattering. Lorentz transmission microscopy, and spin-resolved scanning tunneling microscopy (STM). In addition, electrical currents can drive skyrmion spin textures with a current density 4-5 orders of magnitude lower than that required to move conventional magnetic domain walls. This suggest promising spintronic application can be developed to exploit the topological spin texture as the state variables.

Physically, a magnetic skyrmion is a circular/swirling spin texture in which the spins on the periphery are polarized vertically, the central spin is polarized in the opposite direction, and, in between, the spins can smoothly transition between the two opposite polarizations. A schematic illustration of this texture can be seen by the arrows in FIG. 2. A two-dimensional skyrmion lattice may be formed under a uniform magnetic field; however, the creation of a single skyrmion is more challenging. Spintronic applications can require the accurate control of both the position and the time of skyrmion creation. In some examples, a skyrmion can be created by providing a current 220 to an electrode 215, such as a nanopillar electrode or point contact to generate a current, either spin polarized or unpolarized, onto a top surface of a helimagnetic material 205, wherein the current creates the skyrmion on the surface. The skyrmion is stabilized by applying a static upward magnetic field perpendicular to the helimagnetic material 205 to maintain a ferromagnetic (FM) phase background. The electrode 215, such as the nanopillar electrode, can be deposited on top surface of the helimagnetic material 205, the helimagnetic material having a contact on a bottom surface or a side surface to provide a current drain. In some examples, a spacer layer 210 can be optionally formed over the top surface of the helimagnetic material 205 to provide enhanced electrical properties for the current. The top layer of the nanopillar can be comprised of ferromagnetic (FM) metals such as YiG or alloys such as CoFeB, Co, Fe, CoPt, FePt, FePd, CoPd, or any combination thereof. The spacer layer 210 can comprise an electrically conductive material, wherein the electrically conductive material is selected from non-magnetic materials such as copper, silver, or gold, with the thickness (about 5-nm or greater) sufficient for magnetically decouple the top FM metal layer of the nanopillar and the helimagnetic material 205. The skyrmion is annihilated by reversing a direction that the current is applied. The helimagnetic material 205 is composed of a material selected from FeGe, MnSi, MnGe, $Fe_{1-x}Co_xSi$, CoZnMn, $Mn_2YZ$ Heusler alloy, $(FeCoRh)_2Mo_3N$, Fe/Ir film, Ta/CoFeB, Pt/Co/Ta, Pt/W/CoFeB, Pt/Ta/CoFeB or Ir/Co/Pt. The current 220 is infected at a temperature below the Curie temperature of the helimagnetic material 205. The current 220 is Injected using a point-contact directly touches the helimagnetic surface. The skyrmion can represent computer-readable data in a magnetic memory structure. The helimagnetic material 205 can be about 1-3 nm in thickness.

In some examples, a single skyrmion can be created and/or annihilated by injecting a current 220, such as a spin-polarized current from an scanning tunneling microscope (SIM) tip, into a helimagnetic material 205, such as a ultra-thin Pd/Fe/Ir (111) films having a thickness of about several atomic layers (1-2 nm) at 4.2 K. However, such skyrmions can be created by a chance encounter with local defects, and the microscopic mechanism of the creation process is not clear. Herein, the topological transition of the microscopic spin texture during a dynamical skyrmion creation process. This microscopic picture of the topological transition can provide insight into the condition to create isolated skyrmions and the robustness of this condition against small, random external perturbations. Based on this condition, a controlled skyrmion creation can be realized by applying unpolarized current impulses from a vertical metallic nanopillar. Such a geometry and creation mechanism can be compatible with the standard metal process used in silicon integrated circuits.

Figure 3:
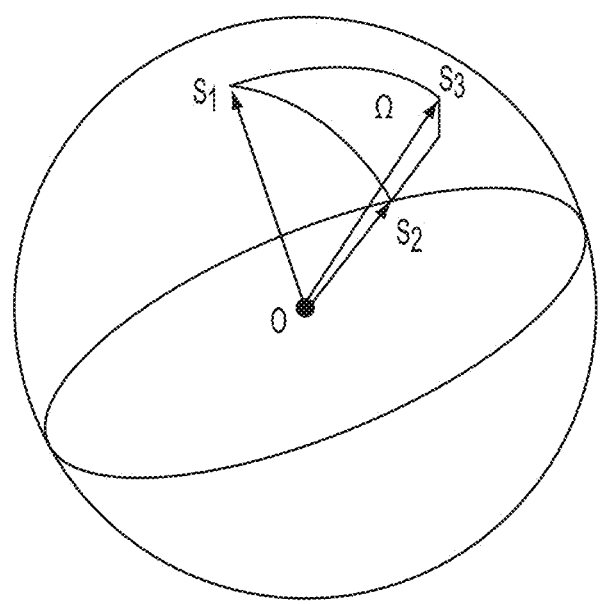
FIG. 3 illustrates a solid angle between three nearest spins, according to examples of the present disclosure.

A skyrmion can be distinguished from a ferromagnet or other trivial states by the topological charge Q, which is a non-vanishing integer. Any two dimensional spin textures can be visualized as a map to a unit sphere, and the topological charge counts the number of times this map wraps the sphere. Geometrically, it is the sum of the directional solid angles of the entire spin texture as shown in FIG. 3. Each Skyrmion contributes ±1 to the total topological charge. The definition of Q can be expressed by the following equation:

$$Q = \frac{1}{4\pi}\int d^2 rS \cdot (\partial_x S \times \partial_y S). \qquad \text{Equation 1}$$

Equation 1 has been previously employed, but is defined only within the continuum limit where all the spins are almost parallel to their neighbors. In this limit, magnetic dynamical processes can only distort the geometry of the spin texture, but cannot change the wrapping number in the spin space. Thus, the topological charge defined by Eq. 1 can be conserved during any time evolution governed by the Landau-Lifshitz-Gilber (LLG) dynamics. therefore, although Eq. 1 is valid for both the ferromagnetic phase and the skyrmion phase a cannot describe the topological transition between the two. In this transition process, the neighboring spins can dramatically deviate from each other, causing the continuum limit to break down. In order to study a topological transition process, a new definition of the topological charge is required. Herein, a lattice version of topological charge that provides a microscopic picture of the spin evolution during the process of a topological transition.

Figure 4C:
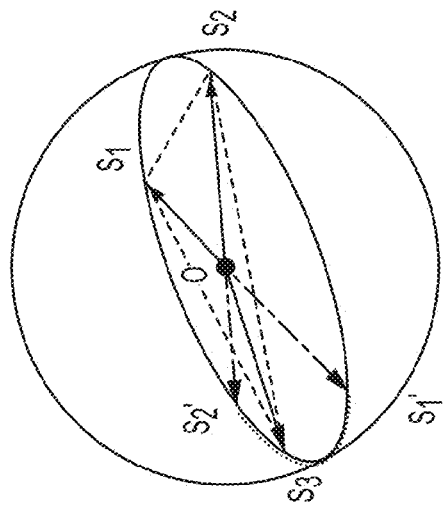
FIG. 4C illustrates a typical spin configuration at the moment of topological transition, according to examples of the present disclosure.
Figure 4B:
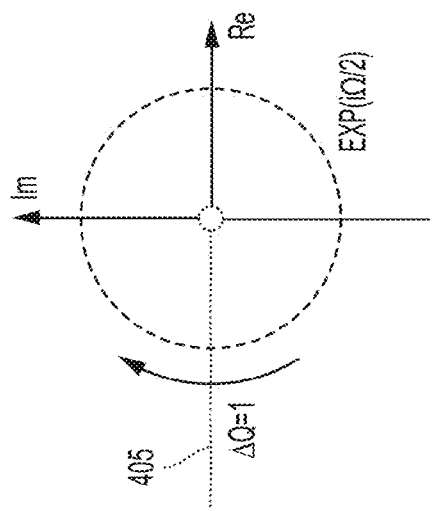
FIG. 4B illustrates a change in the topological charge of ±1 causing $e^{i\Omega\Delta/2}$ to cross a branch cut, according to examples of the present disclosure.
Figure 4A:
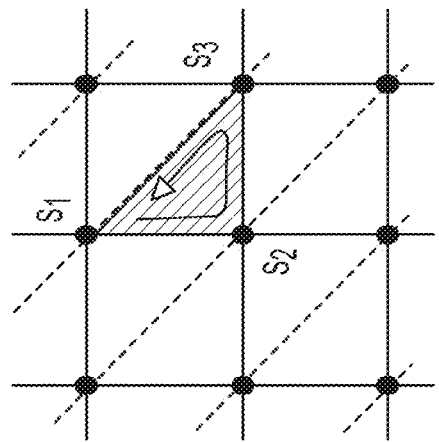
FIG. 4A illustrates a triangulated square lattice, according to examples of the present disclosure.

To define the topological charge on a square lattice mesh, as illustrated in FIG. 4a, the entire lattice can be triangulated, and the solid angle $\Omega_\Delta$ for each triangle $\Delta(S_1, S_2, S_3)$ can be calculated using equation 2, where $$\rho = [2(1+S_1 \cdot S_2)(1+S_2 \cdot S_3)(1+S_3 \cdot S_1)]^{1/2}$$

is the normalization factor.

$$\exp\left(i\frac{\Omega_\Delta}{2}\right) = \rho^{-1}[1 + S_1 \cdot S_2 + S_2 \cdot S_3 + S_3 \cdot S_1 + iS_i \cdot (S_2 \times S_3)], \quad \text{Equation 2}$$

$$-2\pi < \Omega < 2\pi$$

The lattice version of the topological charge Q can then be given by summing over all of the triangles using Equation 3.

$$Q = \frac{1}{4\pi} \sum_\Delta \Omega_\Delta \quad \text{Equation 3}$$

In the continuum limit, the definition given by Eq. 3 is consistent with Eq. 1. Note that the triangulation shown in FIG. 4a may not be unique. However, as long as the three spins in each triangle follow a counter-clockwise order, the definitions given by Eqs. 2 and 3 can be valid on any triangulation pattern. By definition, the directional solid angle $\Omega_\Delta$ ranges from $-2\pi$ to $2\pi$ so that the negative real axis of the complex plane in Eq. 2 is a branch cut. The exponential $e^{i\Omega_\Delta/2}$ can lie on the branch cut 405 in the complex plane when $S_1 \cdot (S_2 \cdot S_3) = 0$, and $1 + S_1 \cdot S_2 + S_2 \cdot S_3 + S_3 \cdot S_1 < 0$. $\Omega_\Delta$ is $2\pi$ immediately above, and $-2\pi$ below, the branch cut 405. Any dynamical process causing $e^{i\Omega_\Delta/2}$ to cross the branch cut 405 can be accompanied by a change in the topological charge of $\pm 1$ as shown in FIG. 4b. To trigger an even crossing the branch cut, the dynamical process can drive three spins $S_1, S_2, S_3$ in one particular triangle coplanar from the condition $S_1 \cdot (S_2 \cdot S_3) = 0$. The other condition $1 + S_1 \cdot S_2 + S_2 \cdot S_3 + S_3 \cdot S_1 < 0$ leads to the inequality $(S_1 - S_2) \cdot (S_3 - S_3) > 0$, so that angle $S_1 S_2 S_3$ is an acute angle, and the same holds true for permutation of the three indices 1, 2, and 3, Consequently, three spins generally point 'away' from each other at the branch cut. For fixed $S_1$ and $S_2$, $S_3$ lie on the arc $S_1 S_2$, as shown in FIG. 4c. This coplanar, but highly non-collinear state is achieved during skyrmion creation or annihilation. Thus, the lattice definition of Q can reveal the microscopic origin of the topological transition.

Figure 2:
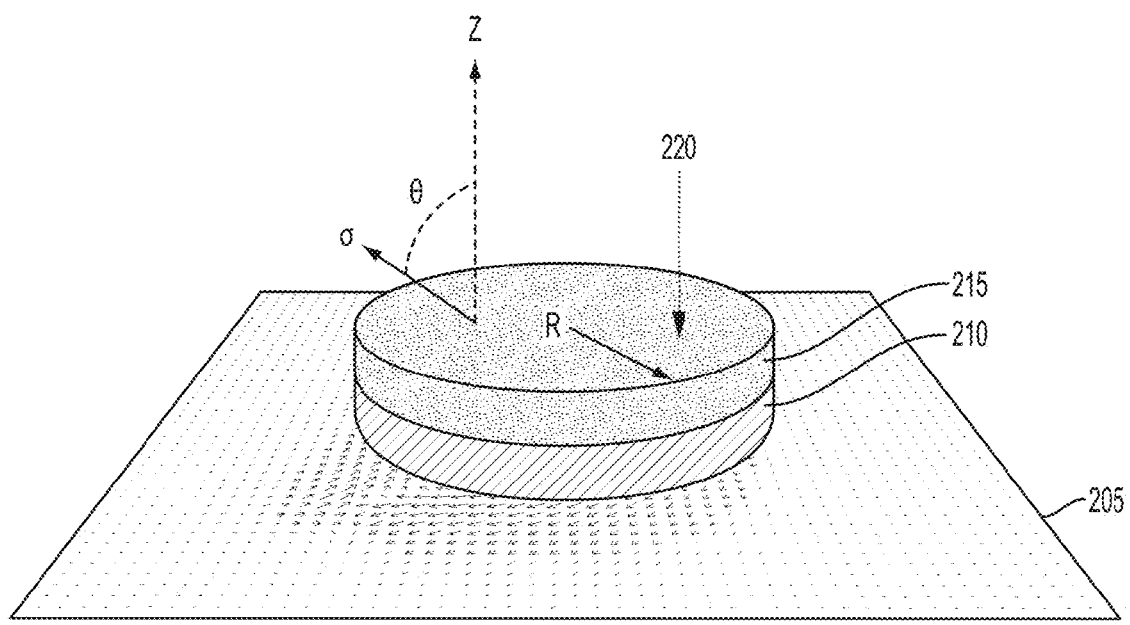
FIG. 2 is a method for skyrmion creation, according to examples of the present disclosure.
Figure 5:
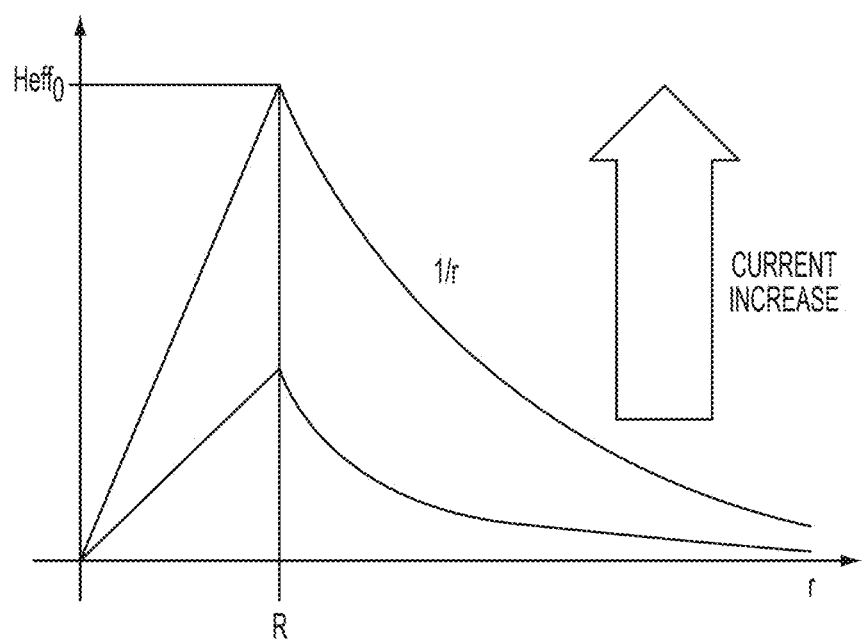
FIG. 5 illustrates the magnitude of a circular field Heir, according to examples of the present disclosure.

The above state can be realized with the application of a circulating magnetic field $H_{cir}$ lying in the plane, and implemented in the setup as illustrated in FIG. 2. A metallic nanopillar electrode of radius R can be deposited on top of a helimagnetic thin film, with a back contact on the bottom of the film which can serve as the drain of the electron current. A uniform external magnetic field $H_0$ can be applied vertically to ensure a ferromagnetic ground state in which all spins can be perpendicularly polarized. When a current is applied between the nanopillar electrode and the back contact, $H_{cir}$ can be generated in the plane of the helimagnetic thin film, dragging the spins towards a swirling spin texture. The magnitude of $H_{cir}$ is schematically shown in FIG. 5. For simplicity of the initial discussion, it can be assumed that the pillar center is exactly located on top of a magnetic site such that the generated swirling texture has rotational symmetry. At the center of the swirling texture, the central spin, $S_0$ and its four nearest neighbors $S_A$, $S_B$, $S_C$, and $S_D$ can form a configuration illustrated in FIG. 6c. Due to the rotational symmetry of the applied field, these four spins can relate to each other by successive ratios of $\pi/2$ about the $\hat{z}$ axis. Thus, the four spins can share the same angle $\theta$ to the plane of the film, and the same azimuthal angle $\phi$ measured from x or y axis respectively. The effective field experienced by the central spin is along the z direction with an amplitude calculated using Equation 4, where J and D are the strength of the Heisenberg and the DM interaction respectively.

$$H_{eff}^0 = 4J\sin\theta - 4D\cos\theta\sin\varphi + H_0. \quad \text{Equation 4}$$

The direction of the electrical current can be chosen so that the swirling directions of the circulating field is the same as that of the in-plane spin component of a skyrmion, therefore $\phi$ is about $\pi/2$ and sin $\phi$ is positive. Before a skyrmion can be created, the circulating field pulls spins $S_A$, $S_B$, $S_C$, and $S_D$ downward onto the plane reducing the angle $\theta$. $H_{eff}^0$ therefore decreases accordingly, but still remains positive. When $\theta$ reaches a threshold as the four spins rotating towards the plane, $H_{eff}^0$ can reverse its sign, and as a result spin $S_0$ can quickly flip down into the $-z$ direction. This process can change the topological charge by an integer and create a skyrmion.

To demonstrate this process, $S_0$ and its nearest neighbors, $S_A$, $S_B$, $S_C$, and $S_D$, can be drawn in a unit sphere at the state immediately before the reversal of the central spin as shown in FIG. 7. $S_{A'}$, $S_{B'}$, $S_{C'}$, and $S_{D'}$ represent the mirror points of $S_A$, $S_B$, $S_C$, and $S_D$, with respect to the sphere center. Both planes $S_A$, $S_B$, $S_C$, and $S_D$ and $S_{A'}$, $S_{B'}$, $S_{C'}$, and $S_{D'}$ can be parallel with the equatorial plane, and the four points in each plane can be equidistant. Through a fast process, $S_0$ can rapidly switch from the north pole (N) to the south pole (S) along a spherical arc. Further, when $S_0$ is located on the geodesic arc $S_A S_{B'}$, shown as point P in FIG. 6e, the three spins $S_A$, $S_B$, and $S_0$ are coplanar. As $S_0$ crosses arc $S_A S_{B'}$, the solid angle formed by the three spins can change signs, resulting in a change in $\Omega_{66}$ of $4\pi$ and a change in the topological charge in Eq. 3 of 1. The same process applies to the other arcs $S_B S_{C'}$, $S_C S_{D'}$, and $S_D S_{A'}$. The four arcs $(S_A S_{B'}, S_B S_{C'}, S_C S_{D'}, \text{ and } S_D S_A)$ can form a closed loop enclosing the south pole as shown by the curve 605 in FIGS. 6e and 7. Therefore the trajectory of $S_0$ crosses this closed loop once, and an integer change of the topological charge is guaranteed regardless of the actual geometry of the $S_0$ trajectory. A single skyrmion is thus created in this process.

The above examples assume a perfect rotational symmetry during the topological transition process. However, due to manufacturing tolerances or thermal fluctuations, perfect rotational symmetry may not be achievable. Also, the center of the nanopillar generally will not coincide with a spin site in real systems. These symmetry breaking effects can distort the corresponding spherical quadrilateral $S_A S_B S_C S_{D'}$ from being a symmetric case, and the reversal of $S_0$ does not, in general start exactly from N and end at S. However, as long as the perturbation is moderate, this distortion generally does not alter the fact that $S_A S_B S_C S_{D'}$ is a closed loop dividing the surface of the unit sphere into two parts, where the starting and ending points of $S_0$ can be located respectively. Driven by $H_{cir}$, the spins in the swirling texture can be forced downwards to the plane so that the closed loop $S_A S_B S_C S_{D'}$ is enlarged and approaches the equator. Thus, the trajectory of $S_0$ crosses the closed loop $S_A S_B S_C S_{D'}$ an odd number of times. The topological charge changes by one, and only by one, and a local skyrmion can he created. The robustness of this controlling mechanism of the topological transition can be further confirmed by LLG dynamical simulations.

Figure 6A:
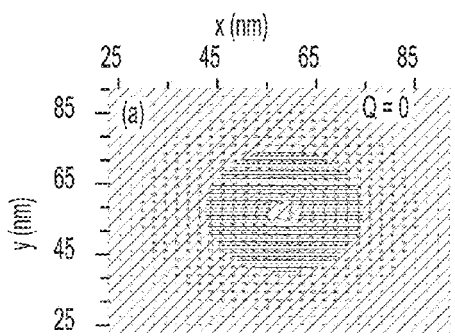
Figure 6B:
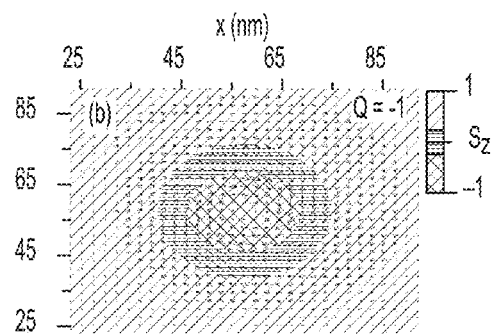
Figure 6C:
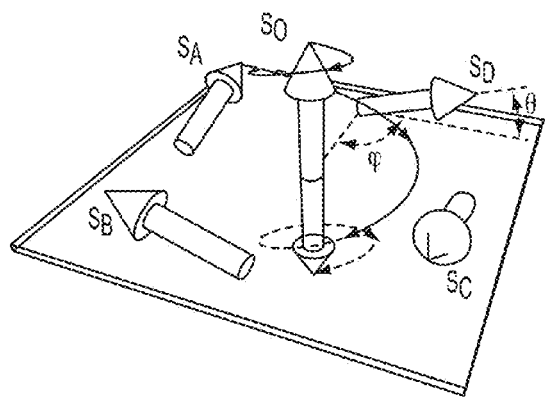

In order to numerically calculate the required condition and to estimate the feasibility of the skyrmion creation mechanism, dynamical simulations of a spin system based on the LLG equation can be performed. A stochastic field can be applied to include the effect of thermal fluctuations at finite temperatures. Details of the simulation can be found in the 'methods' section, below. With the topological charge defined on a lattice, the creation, of a skyrmion can be detected by calculating the topological charge Q at each time step during the simulation. Snapshots of dynamical simulations at zero temperature are shown in FIGS. 6a, 8, and 9. Starting from the ferromagnetic initial state, as the strength of the circulating field, $H_{cir}$, increases linearly with time, the spins around the pillar electrode can increase their in-plane components, which can form a swirling spin texture (FIG. 6a). When $H_{cir}$ reaches a value in FIG. 8, an integer topological charge can be created indicating the creation of single skyrmion. This new-born skyrmion can be surrounded by an extended swirling spin texture. Once a skyrmion core region is formed, further increase of the circulating field generally does not bring any noticeable change. Further, once the topological charge is detected, $H_{cir}$ can be slowly turned off. After the circular magnetic field is removed, the extended swirling spin texture can revert to the ferromagnetic state, thereby leaving a single skyrmion at the center, as seen in FIG. 9. By reversing the nanopillar current and creating a circulating field with opposite swirling direction, this skyrmion can be annihilated.

To determine the external field $H_c$ for skyrmion creation, $H_{cir}$ can be increased linearly at a slow enough rate such that an adiabatic limit is valid where the local spins follow the effective field, $H_{eff}$. The field magnitude, $H_0$, can be defined as the amplitude of the circulating field at the pillar electrode boundary R at the moment the topological charge is created. The results are shown in FIG. 10 for different values of background field $H_0$ and DM interaction strengths D. In general, the field $H_c$ is the same order of magnitude as the background field $H_0$, and the dependence of $H_c$ on $H_0$ is superlinear. Although the above simulation places the electrode center exactly on a magnetic site, when the electrode center is scanned throughout the central plaquette, $H_c$ can vary by less than 0.7% as shown in FIG. 11.

In one example, the trend in FIG. 15 can be explained by the central effective field estimated by Eq. 4. When the topological transition starts, the value $\theta_c$ satisfies $4 J\sin\theta_c - 4 D\cos\theta_c \sin\phi + H_0 = 0$. $\theta_c \sim (4 D\sin\phi - H_0)/4 J$. Larger D values or smaller $H_0$ values can lead to a larger $\theta_c$, which can be achieved by a smaller circulating field $H_c$. The above example is also consistent with the energetic considerations of the system. For example, to create a skyrmion, a potential barrier is overcome-which can consist of the energy difference $\Delta = E_{Skyr} - E_{Ferro}$ between the skyrmion energy $E_{Skyr}$ and ferromagnetic background $E_{Ferro}$. The energy difference $\Delta$ can be sensitive to the strength of the DM interaction D and the background field $H_0$ as shown in FIG. 12. Smaller D or larger $H_0$ can correspond to a larger energy difference $\Delta$ and a larger potential barrier for the creation of a skyrmion. The field can increase when D decreases or $H_0$ increases, since more energy will be required from the circulation field.

Since the local topological transition is generally robust against the symmetry-breaking effects as discussed above, thermal fluctuations may not prevent the proposed skyrmion creation. This is generally easier to achieve at finite temperatures, since finite temperatures require smaller fields as shown in FIG. 13. In this calculation, each value of $H_c$ can be calculated as an average over 400 sampling runs. At finite temperatures, thermal fluctuations can work together with the magnetic stimuli given by Heir to overcome the potential barrier separating the skyrmion phase from the ferromagnetic phase. At even higher temperatures, thermal fluctuations alone can be capable of exciting skyrmions at uncontrollable locations. For application purposes, such high temperature regimes should generally be avoided.

After a single skyrmion has been created, the stability of the skyrmion is ascertained after the circulating field is turned off. FIG. 14 is a typical snapshot of a stable skyrmion at a finite temperature. Although the skyrmion has a higher energy compared to the ferromagnet (as shown in FIG. 15), spontaneous decay from the skyrmion phase to the ferromagnetic phase will not occur since it is topologically protected. The dynamical process of decay follows a trajectory that crosses the branch cut, The intermediate coplanar state required at a branch cut has a high energy which can create an activation energy barrier $E_a$, which can block the decay process, as shown in FIG. 15. Additionally, random stimuli at finite temperatures can demonstrate that this barrier cannot be easily overcome.

The height of the activation energy $E_a$ is determined by the condition of a topological transition. The topological constraints can require that, during skyrmion decay, three spins $S_1$, $S_2$, $S_3$ in one plaquette become coplanar and point away from each other such that $1+S_1 \cdot S_2+S_2 \cdot S_3+S_3 \cdot S_1 < 0$. Consequently two pairs of neighboring spins $(S_1, S_2)$ and $(S_2, S_3)$ can have the Heisenberg interaction $-J(S_1 \cdot S_2+S_2 \cdot S_3) > J(1+S_3 \cdot S_1) \geq 0$. In contrast, the neighboring spins of a stable skyrmion do not deviate much from each other, as the energy of the intermediate coplanar state is generally higher than the skyrmion energy by an activation energy of the order of J.

This estimation is consistent with the value of $E_a = 1.7$ J that was determined from numerical simulations. The activation energy can be extracted numerically by examining the lifetime of a single skyrmion as a function of temperature. A skyrmion can be simulated at a finite temperature until the topological charge switches from 1 to 0 due to the random thermal fluctuations. The time of the annihilation is recorded. This simulation was repeated 1000 times at each temperature for different background fields are shown in FIG. 16. At low temperatures, a smaller $H_0$ can result in a more stable single skyrmion with a longer lifetime. At higher temperatures, where $k_B T$ approaches J, all of the curves in FIG. 16 converge and decay exponentially. Further, for transition from skyrmion to ferromagnet, the transition rate k can obey the Arrhenius equation $k \sim \exp(-E_a/k_B T)$. The lifetime $\tau$ is the inverse of k so that $\tau \sim 1/k \sim \exp(E_a/k_B T)$. The plot of $\ln\tau$ in FIG. 17 is generally linear in the inverse temperature 1/T. Plots for various $H_0$ values can be nearly parallel with each other with an activation energy of $E_a \sim 1.7$ J. Further analysis has shown that this activation energy does not depend on the DM interaction, as shown in FIG. 18. These results confirm the topological origin of the activation energy that stabilizes the single skyrmion.

To confirm the feasibility of the disclosed skyrmion creation method, a simulation performed using physical parameters of an FeGe thin film. The lattice constant of FeGe is a=4.70 Å, and the helical period is $\lambda = 70$ nm. Utilizing the formula $\tan(2 \pi a/\lambda) = D/\sqrt{2}$ J, D/J,=0.0597, where $J \sim k_B T_c \sim 24$ meV. At a low temperature of $T \sim 0.J/k_B \sim 28$ K, with an effective easy-plane field of 0.7 T and external magnetic field of 1 T, which can ensure a ferromagnetic ground state for FeGe/Si(111) epitaxial thin films, numerical simulations illustrate that a pillar electrode with a 75 nm radius and a current density of $6 \times 10^8$ A/cm$^2$ can generate a single skyrmion on a ferromagnetic FeGe thin film. The large curie temperature for this material allows for experimentation over a wide range of temperatures where thermal fluctuation will further reduce the current density required. In experiments, current densities on the order of $10^8$ A/cm$^2$ can be commonly employed for moving magnetic domain walls, in the examples of the present disclosure, the heating effect can be further reduced by selecting materials with low resistivity for the nanopillar, such as Cu and Au, Furthermore, a short current pulse could he employed to minimize the switching energy and the switching time. Numerical simulations can show that the skyrmion can he generated within a characteristic time scale of a nanosecond for thin-film FeGe.

Methods

The geometry of the skyrmion creation shown in FIG. 2 can consists of a vertical metallic electrode deposited on top of a helimagnetic thin film. A uniform current can be injected though the vertical pillar. The direction of the magnetic field generated by this current can be tangential, and the magnitude can be determined by Ampere's law such that:

$$H(r) = h(r/R)^{\pm 1} \text{ for } r \leq R \qquad \text{Equation 5}$$

Where R is the radius of the pillar and h is the field peak located at the pillar boundary r=R. In the following examples, the pillar radius R is larger than the characteristic skyrmion radius, so that in the central regions of interest, Eq. 5 is a good approximation. In addition to the circulating field, a static upward magnetic field $H_0$ can also be applied perpendicular to the helimagnetic thin film to maintain an FM phase background. The full spin Hamiltonian can be given by:

$$H = \sum_{\langle i,j \rangle} [-JS_i \cdot S_j + D\hat{r}_{ij} \cdot (S_i \times S_j)] - \mu_B \sum_i S_i \cdot (H_{cir} + H_0) \qquad \text{Equation 6}$$

Where the two terms in the square bracket are the Heisenberg and DM interactions respectively, $\mu_8$ is the Bohn magneton, and the last term is the Zeeman coupling in Eq. 5. Spin dynamics can be simulated by numerically solving the Landau-Lishitz-Gilbert (LLG) equation $$\dot{S} = -\gamma S \times H_{eff} + \alpha S \times \dot{S} \qquad \text{Equation 7}$$

Where $\gamma = g/h$ is the gyromagnetic ratio and $\alpha$ is the Gilbert damping coefficient $H_{eff}$ is the effective field given by $H_{eff} = \partial H/\partial S$. A fourth order Runge-Kutta algorithm can be employed to integrate this first order differential equation. In simulations, J=1, D=0.3, and the pillar radius is R=12. Without loss of generality, a square lattice can be employed. The lattice size can be 100×100 and periodic boundary conditions can be imposed. The choice of $H_0$, e.g. $H_0$=0.09, can set the zero-temperature ground state to be ferromagnetic.

To stimulate the dynamical process at a finite temperature, a stochastic field L can be added onto the effective field in Eq. 7. The dissipation-fluctuation relation $\langle L_\mu(r, t) L_\nu(r', t') \rangle = \xi \delta_{\mu\nu} \delta_{rr'} \delta_{tt'}$ can be satisfied, where $\xi = \alpha k_B T/\gamma$, and T is temperature. The average () can be taken over the realizations of the fluctuation filed. The deterministic Heun scheme can he employed to integrate out the above stochastic LLG equation, Bloch and Néel Type Skyrmions When the Bloch and Neel-type skyrmions are taken into account, the full spin Hamiltonian of a magnetic helix as represented in Eq. 6 is given by $$H = \sum_{\langle i,j \rangle} [-JS_i \cdot S_j + H_{i,j}^{DM}] - \mu_0 \Sigma S_i \cdot H_{Ost}, \qquad \text{Equation 8}$$

where $$\begin{cases} H_{i,j}^{DM} = D\hat{r}_{ij} \cdot (S_i \times S_j) & \text{(Bloch type)} \\ H_{i,j}^{DM} = D(\hat{z} \times \hat{r}_{ij}) \cdot (S_i \times S_j) & \text{(Néel type)} \end{cases}$$

The two terms in the square bracket are the Heisenberg and DM interactions, respectively, and the last term is the Zeeman coupling. $\hat{r}_{ij}$ denotes the unit vector pointing from $S_i$ to $S_j$. At the moment of switching, three spins on one particular triangle are coplanar, and the DM interaction does not contribute to the total energy. The energy of this particular triangle, measured from the ferromagnetic state, is thus given by $$\Delta\varepsilon = J\left(1 - \frac{S_1 - S_2}{2} - \frac{S_2 - S_3}{2}\right) + B_{Ost} \cdot \left(\frac{1}{2} - \frac{S_1 + S_2 + S_3}{6}\right). \qquad \text{Equation 9}$$

Since the spins at the transition are highly non-collinear, the exchange becomes very large, and the Zeeman coupling in the second term in Eq. (4) is thus negligible, From the topological transition requirement, $1+S_1 \cdot S_2+S_2 \cdot S_3+S_3 \cdot S_1 < 0$, it can be obtained that $-J(S_1 \cdot S_2+S_2 \cdot S_3) > J(1+S_3 \cdot S_1) \geq 0$. Thus, $\Delta\varepsilon > J$ has to be satisfied. The maximum value of $\Delta\varepsilon = 2$ J occurs when $S_2$ is anti-aligned with both $S_1$ and $S_3$, such that $J < \Delta\varepsilon < 2$ J. In different switching processes, the actual value of this harrier varies within, this range, determined by the exact spin configurations at the moment of the transition. Since this criteria comes from the generic topological charge analysis, it applies for both the Bloch-type and the Néel-type skyrmions.

Returning back to FIG. 2, a single skyrmion can be created due to an application of a vertical current. Examples of the present disclosure provides for the control of the precise location and the moment of the topological transition is illustrated in FIG. 19(a). A spin-less metallic (usually copper) nanopillar electrode of radius R is deposited on top of a helimagnetic thin film, with a back contact on the bottom of the film which serves as the drain of the electron current. In order to polarize the injected current, a magnetic layer is deposited on top of the copper spacer. The angle between the polarization and the x-y plane is θ. A uniform external magnetic field $H_0$ is applied vertically to ensure a ferromagnetic ground state in which all spins are perpendicularly polarized. In order to quantitatively evaluate the required condition and the feasibility, dynamical simulations of the spin system based on the Landau-Lifshitz-Gilbert (LLG) equation are performed. The equation of motion is given by $$\dot{S} = -\gamma S \times H_{\mathit{eff}} + \alpha S \times \dot{S} + \tau_{STT} \qquad \text{Equation 10}$$

where $\gamma=g/h$ is the gyromagnetic ratio and $\alpha$ is the Gilbert damping coefficient. $H_{\mathit{eff}}$ is the effective field given by $H_{\mathit{eff}}=-\partial H/\partial S$. A fourth order Runge-Kutta algorithm is employed to integrate this first order differential equation. In simulations performed by the inventors, material parameters of FeGe are applied, such that $J=\alpha A_0$ and $D=\alpha^2 D_0$, where $\alpha=2.3$ nm is the choice of the mesh grid size, $A_0=5.33$ meVÅ$^{-1}$ is the exchange stiffness and $D_0=0.305$ meVÅ$^{-2}$ is the DM interaction density. These parameters are chosen such that the simulated helical state period matches with the experiment observation $\lambda=2\pi\alpha/\arctan(D/\sqrt{2}J)=70$. The STT term is written as $$\tau_{STT} = -j\frac{\gamma \hbar p}{2e\mu_0 M_s t}[S \times (S \times \sigma)]$$

where p is the polarization, j is the current density, $\sigma$ is the injected spin orientation, $M_s=10^5$ Am$^{-1}$ is the saturation magnetization and t is the film thickness. A background field, $H_0$, is applied along the $\hat{z}$ direction, perpendicular to the thin film, such that the energy of a FM state matches the energy of a single skyrmion.

A. Oersted field induced creation

First, we consider the creation of a Bloch-type skyrmion by the injection of spin unpolarized current, where all the excitations in the spin texture are induced by the Oersted field associated with the vertical current. Starting from a ferromagnetic (FM) initial state, an unpolarized DC current is injected at t=0. This generates a swirling Oersted field in the plane of the helimagnetic thin film, dragging the spins into a swirling spin texture, which eventually evolve to a single skyrmion at the center. The spin textures before and after this topological transition are shown in FIGS. 6(a) and (b). At the center of the swirling texture, the central spin, $S_0$, and its four nearest neighbors $S_A$, $S_B$, $S_C$, and $S_D$ form a configuration illustrated in FIG. 6(c). Due to the rotational symmetry of the applied field, these four spins relate to each other by successive rotations of wt about the $\hat{z}$ axis. They thus share the same angle $\theta$ to the plane of the film, and the same azimuthal angle $\phi$ measured from the x or y axis, respectively, in the case of a Bloch-type skyrmion, the effective field experienced by the central spin is along the s direction with an amplitude of $H_{\mathit{eff}}^0=4 J \sin\theta-4 D \cos\theta+H_0$ where J and D are the strength of the Heisenberg and the DM interaction respectively. The direction of the electrical current is chosen so that the swirling direction of the circulating field is the same as that of the in-plane spin component of a skyrmion; therefore $\phi$ is about $\pi/2$, and $\sin\phi$ is positive. Before a skyrmion can be created, the circulating field pulls spins $S_A$, $S_B$, $S_C$, and $S_D$ downward towards the plane reducing the angle $\theta$. $H_{\mathit{eff}}^0$ therefore decreases accordingly, but still remains positive. When $\theta$ reaches a threshold as the four spins rotate towards the plane, $H_{\mathit{eff}}^0$ reverses its sign, and as a result, spin $S_0$ quickly flips down into the $-z$ direction. This process changes the topological charge by an integer and thus creates a skyrmion. Note that the contribution from the DM interaction in Néel-type skyrmions cannot generate a negative term in $H_{\mathit{eff}}^0$, therefore the swirling Oersted field can only create a Bloch-type skyrmion.

Figure 6D:
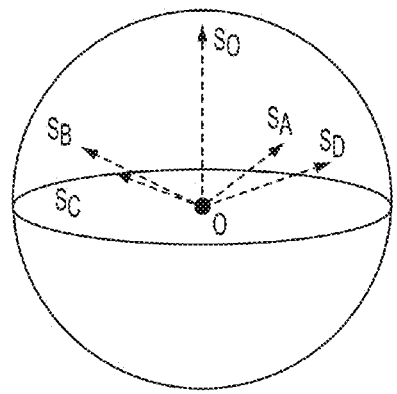
Figure 6E:
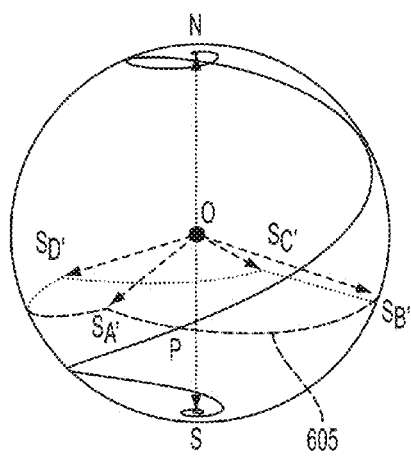

To demonstrate this process, we draw $S_0$ and its nearest neighbors, $S_A$, $S_B$, $S_C$, and $S_D$, in a unit sphere at the state immediately before the reversal of the central spin [FIG. 6(d)]. $S_{A'}$, $S_{B'}$, $S_{C'}$, and $S_{D'}$ are the mirror points of $S_A$, $S_B$, $S_C$, and $S_D$ with respect to the sphere center [FIG. 6(e)]. Both planes $S_A$, $S_B$, $S_C$, and $S_D$ and $S_{A'}$, $S_{B'}$, $S_{C'}$, and $S_{D'}$ are parallel with the equatorial plane, and the four points in each plane are equidistant. Through a fast process, $S_0$ rapidly switches from the north pole (N) to the south pole (S). When $S_0$ is located on the geodesic arc $S_{A'}$, $S_{B'}$ shown as point P in FIG. 6 (e), the three spins $S_A$, $S_B$ and $S_0$ are coplanar. As $S_0$ crosses arc $S_{A'}$, $S_{B'}$, the solid angle formed by the three spins changes sign resulting in a change in $\Omega$ of $4\pi$ and a change in the topological charge in Eq. (8) of 1, $S_C S_{D'}$, and $S_D S_{A'}$. Notice that these four arcs form a closed loop enclosing the south pole as shown by the curve 605 in FIG. 6(c). Therefore, the trajectory of $S_0$ crosses this closed loop once, and an integer change of the topological charge is guaranteed regardless of the actual geometry of the $S_0$ trajectory. A single skyrmion is thus created.

Figure 6F:
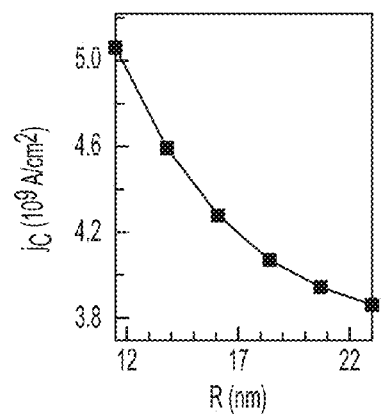

The current density, $j_c$ to trigger the topological charge is shown in FIG. 6(f), The value of $j_c$ is on the order of $10^9$ A/cm$^2$, which is three orders of magnitudes larger than the typical switching current density applicable to integrated circuits. An increase in the electrode radius of several nanometers can reduce $j_c$ but it cannot provide improvements by orders of magnitudes.

B. Spin Transfer Torque (SSI) Driven Switching

Since the threshold current is so high, skyrmion creation due to a pure Oersted field is not practical. Spin-polarization of the injected current can reduce the threshold current density by one order of magnitude. In this case, the dynamical process is dominated by the STT, which can be a mechanism to switch nano-magnets in spintronic integrated circuits.

Several snap shots of this dynamical process are shown in FIGS. 19A-19D. After the current is turned on, the STT and the Oersted field drive the spins into the x-y plane near the electrode. Since spins at the periphery deviate from the outside FM configuration, the DM energy starts to increase. This drives the spin texture to form a bubble-like domain, in which the center spins present negative z components, while the spins at the periphery give large in-plane components. The bubble-like domain then continues to grow and starts to wrap into a circular domain wall with a singularity. Around the singularity, the spins gradually develop into an antiparallel configuration, which then generate a quick, drastic dynamical process that creates a topological charge of −1. In contrast to the creation induced by pure Oersted fields, the STT triggered creation works with both Bloch and Néel type skyrmions. The spin trajectories corresponding to the local topological transition are shown in FIG. 19D, which follows the coplanar and non-collinear configuration discussed In the previous section. The current density to trigger the skyrmion creation event is evaluated through a series of LLG simulations. For a low current density, excitations damp away very fast, and no skyrmion is created. The creation of skyrmions occurs only when the current density reaches a value, $j_c$. The phase diagram of $j_c$ is a function of the spin polarization angle, $\theta$, and the electrode radius, R, as shown in FIGS. 20A-20C.

Figure 21B:
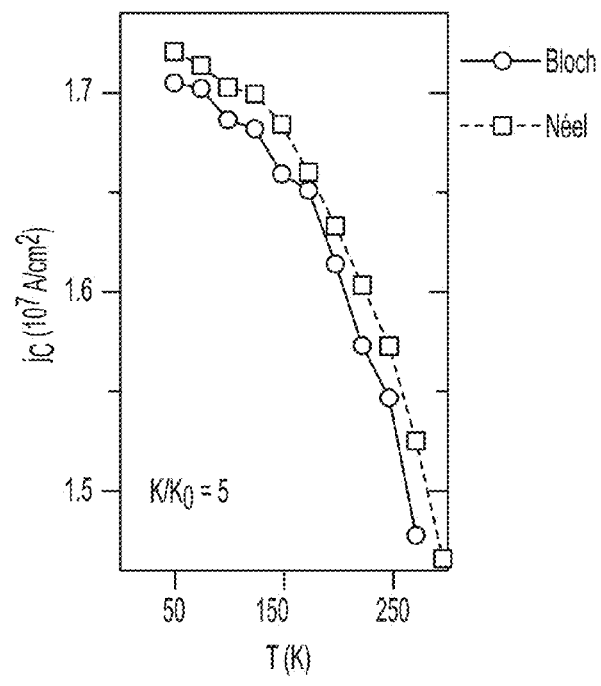

Here R varies from 11.5 nm to 25.3 nm, while the polarization of the injected current is modified from $-\hat{z}$ to the x-y plane ($90<\theta<180$). The skyrmion creation does not happen when $\theta<90$. In this calculation, both the Néel-type and the Bloch-type skyrmion creations are examined using the same set of parameters. Despite the differences in the spin dynamical details, the phase diagrams for the two types of skyrmions are quite similar. The minimum current density occurs at θ~110, where the polarization is close to the in-plane case. For both skyrmion types, $j_c$ is approximately $10^9$ A/cm$^2$, which is similar to the switching current density due to spin orbit torques estimated by previous numerical estimates. Increasing the electrode radius can further decrease the current density but only on a linear scale rather than an exponential scale. The reliability and the dynamical details of the switching process significantly depends on θ, the orientation of the spin polarization. The SIT can generate an 'anti-damping' effect during the precession of the local magnetic moment when the injected spin is anti-parallel to the precession axis. The anti-damping can either induce a consistent oscillation or even, the switching of a single-domain nano magnet. This is similar to the switching of a single skyrmion, according to examples of the present disclosure, in the case of θ<90, the excitations induced by the torque damp away so quickly that no topological transition could occur with a reasonable current density. In the case of 90<θ<180, switching becomes possible. Since the STT is given by S×(S×σ), the maximum value of the torque at t=0 occurs when θ=90. The torque becomes zero in the case of θ→180, where the required current density reaches its maximum in the phase diagram. In the case of a large θ, the dynamical effect continues after the skyrmion is created, where the oscillation of the topological charge occurs. The time evolution of the topological charge of a Bloch-type skyrmion is presented in FIG. 21(b), in which several different angles are examined close to θ=90 and θ=180. Within 800 ps, topological charge (sometimes more than 1) quickly switch on and off in the case of θ~180 due to the constant oscillations driven by the STT. The final state is highly sensitive to the duration of the applied current and the details of the geometry. On the other hand, the topological charge becomes stable in the case of the in-plane polarization. The switching can occur in ~60 ps, after which no further excitations can he Initiated and no change of the skyrmion number is witnessed. A similar trend is also observed in the Néel-type skyrmions. Small changes in the angle do not strongly affect the switching outcome, indicating that the in-plane polarization is best for creating skyrmions for application purposes.

C. Easy-Plane Anisotropy and Heating Effects

Although the current density of $10^8$ A/cm$^2$ is still difficult to achieve in applications, the threshold current can he further reduced by an order of magnitude due to easy-plane anisotropy and heating effects. The easy-plane uniaxial anisotropy is written in the Hamiltonian as $H_{ansi}=\Sigma_i KV^{(K/K_0)2}$ where K is the anisotropy energy density and V is the volume of each local spin. This term is physically induced by a combination of the strained structural effects at the interface and the demagnetization effects due to the aspect ratio. In a helimagnet, it has been proposed that K is measured by $K_0$, the effective stiffness of the conical phase determined by material parameters (for FeGe, $K_0=1.7\times10^3$ J/m$^3$). Recent experimental results indicate that the skyrmion phase in a FeGe thin film can be significantly extended in the phase diagram, and the value of $K/K_0$ reaches ~1 when the thickness reduces to 5 nm. Larger values of anisotropy are expected if the thickness further decreases. Since the anisotropy energetically prefers the in-plane configuration, it helps the spin transfer torque to drive the spins to reach the coplanar switching configuration. The required current density can thus be reduced. Starting from the optimum situation in the phase diagram (θ=110, R=25.3 mm), the value of $K/K_0$ is modified from 1 to 5 in calculations according the examples of the present disclosure. As shown in FIG. 21(a), the easy-plane anisotropy reduces the switching current density from by approximately a factor of 2.2 for both types of skyrmions.

Figure 22A:
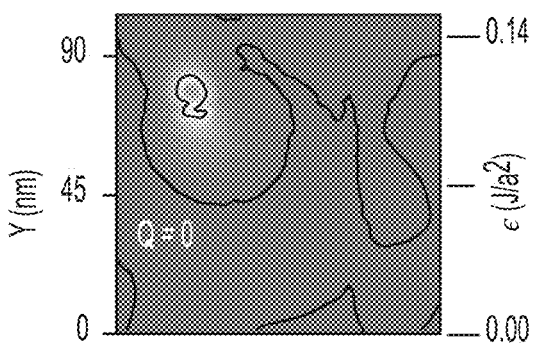
Figure 22B:
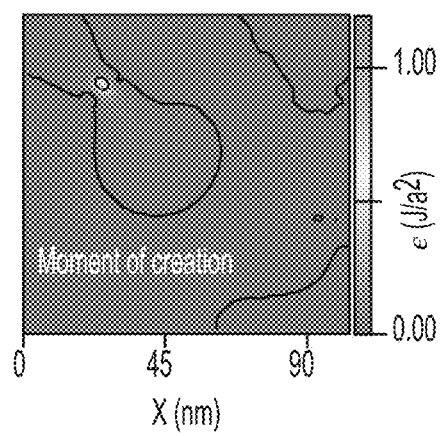
Figure 22C:
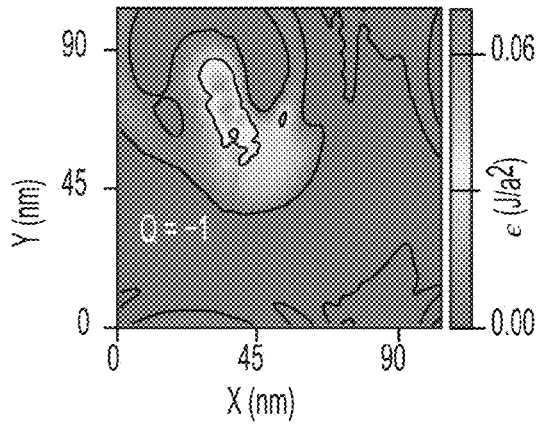

The thermal fluctuation given by a finite temperature is further examined numerically, In order to include this effect, a stochastic field 1 is added onto the effective field in Eq. (10). The dissipation-fluctuation relation $\langle L_\mu(r, t) L_\nu(r', t')\rangle=\xi\delta_{\mu\nu}\delta_{rr'}\delta_{tt'}$ satisfied, where $\xi=\alpha k_B T/\gamma$, and T is the temperature. The average () is taken over the realizations of the fluctuation field. The deterministic Heun scheme is employed to integrate out this stochastic LLC equation. Below $T_c$ (270 K in FeGe), the average switching current density based on 400 sampling runs is obtained for both the Néel-type and the Bloch-type skyrmions. The results are shown in FIG. 21(c). Although thermal fluctuations randomize the local spins at each time step, the overall dynamical process of the skyrmion creation is similar to that at the zero temperature, This demonstrates the stability of the skyrmion creation scheme below $T_c$. The average switching current density decreases slightly due to the thermal fluctuations, indicating a negligible heat assisted switching effect. Above $T_c$, although the switching current can be further reduced, the magnetic order starts to vanish, where random topological charges can be spontaneously excited by thermal fluctuations. This should be avoided in the proposed switching scheme, IV. Topological Protection The difficulty of skyrmion switching originates from the spin configuration required by the topological transition. The energy landscapes several picoseconds around the moment of creation are shown in FIGS. 22(a)-(c).

Figure 22E:
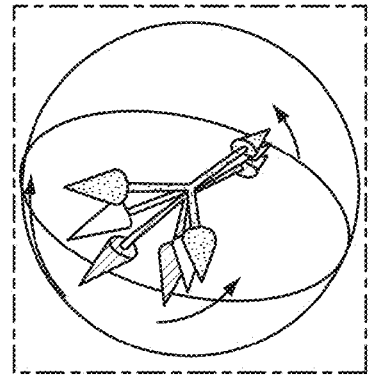

Exactly at the transition moment, energy is highly concentrated at the switching-position, where the energy density overcomes the minimum topological energy barrier, J. For both Néel-type and the Bloch-type skyrmion switching, the maximum energy density evolves through time, which is plotted in FIG. 22D. Even when the injected current density is only 100 A/cm, below $j_c$, the energy density cannot overcome the topological barrier, and no skyrmion can be created. Both of the two cases present similar line shapes of the energy evolution, despite the significant differences In the dynamical details. In both cases, fast skyrmion switching within ~60 ps is achieved. The barrier height of the Néel type is a little larger than that of the Bloch type, which is determined by the exact switching configuration. As shown in FIG. 22E, the spin alignment is more non-colinear compared to that given in FIG. 19E, contributing more exchange energy than that of the Bloch type. The difference in this configuration comes from the swirling Oersted, field induced by the vertical current. For the Bloch-type skyrmions, the Oersted field helps the in-plane DM interaction form the co-planar texture, while it does not assist the out-of-plane DM interaction in the Néel-type skyrmions. As shown in the phase diagrams in FIGS. 20A-20C. this difference In the barrier does not significantly affect the switching current density.

Figure 22D:
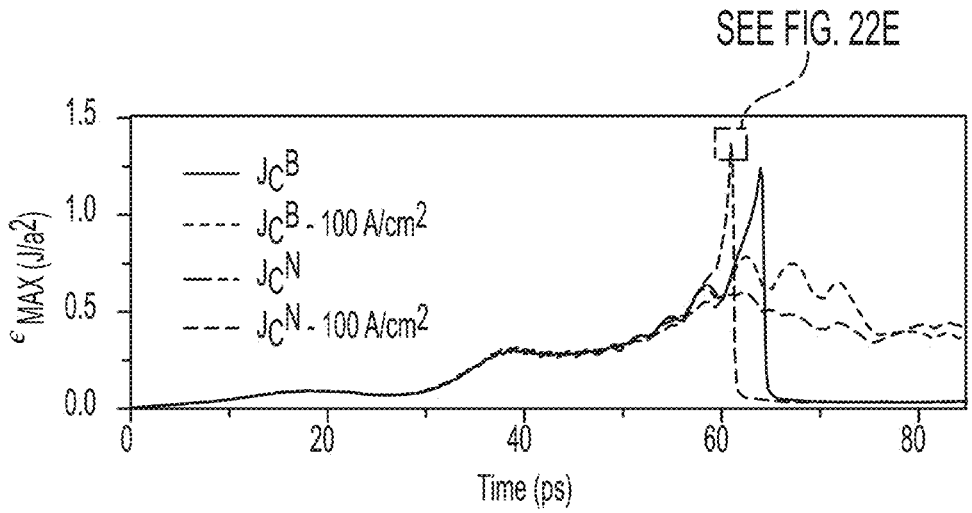

This estimate of the topological protection barrier can also be numerically deter mined from the thermal activation energy. The activation energy of each topological charge is extracted numerically by examining the lifetime of a topological charge as a function of temperature. A skyrmion is simulated at finite temperature until the topological charge switches from –1 to 0 due to the random thermal fluctuations. The time of the annihilation is recorded. This simulation is repeated 1000 times at each temperature, and the average lifetime τ is determined as a function of temperature. Plots of τ versus temperature for different background fields $H_0$ shown in FIG. 23(a). At low temperatures, a smaller $H_0$ results in a more stable single skyrmion with a longer-lifetime. At higher temperatures such that $k_aT$ approaches J, all of the curves in FIG. 23(a) converge and decay exponentially. For the transition from skyrmion to ferromagnet, the transition rate k obeys the Arrhenius equation $k\sim\exp(-E_a/k_BT)$. The lifetime τ is the inverse of k so that $\tau\sim 1/k\sim\exp(E_ak_BT)$. The plot of ln τ in FIG. 23(b) is linear in the inverse temperature 1/T. Plots for various H, are nearly parallel with each other with an activation energy of $E_a\sim 1.7$ J. Further analysis shows that this activation energy is also insensitive to the DM interaction as shown in FIG. 23(c). The activation energy $E_a\sim 1.7$ J determined from the Arrhenius plots represents the barrier to decay in a skyrmion annihilation process. The maximum activation energy density of 1.25 J per spin determined by direct calculation in FIG. 22(d) represents the energy barrier to creation. These values fall within the range $J<\Delta\epsilon<2$ J determined from the topological charge analysis leading to Eq. (9), and they support the picture of the topological origin of the activation energy that stabilizes the single skyrmion.

A topological charge analysis provides insight into the locally triggered transition from a trivial to a non-trivial topological spin texture of the Néel or Bloch type skyrmion. The topological protection of the magnetic skyrmion is determined by the symmetric Heisenberg exchange energy. The topological charge analysis, direct, micromagnetic calculation, and extraction from Arrhenius plots created from ensemble averaged finite temperature calculations all give consistent values for the energy barrier determined by the spin geometry at the point of transition between a trivial and non-trivial spin topology of $J<\Delta\epsilon<2$ J. A scheme to create single skyrmions is analyzed for both Néel-type and Bloch-type in helimagnetic thin films utilizing the dynamical excitations induced by the Oersted field and the STT given by a vertically injected spin-polarized current The switching current density is ~10·A/cm, which decreases with the easy-plane type uniaxial anisotropy and thermal fluctuations. In-plane spin polarization of the injected current performs better than out-of-plane polarization, and it provides ultrafast switching times (within 100 ps) and reliable switching outcomes.

The physical mechanisms and fundamental limits appropriate for particular skyrmion applications can depend on the type of architecture used. The architectures and associated applications can provide a focus for assessing performance metrics, allowing for comparisons to be made with competing technologies. For example, racetrack memory can be an excellent architecture for applying skyrmions to information storage applications, as the skyrmions can clearly map onto the role of the domain walls. Alternatively, other information architectures for both memory and computation could be used as well. For example at least two memory schemes lend themselves to a dense crossbar array. Computation approaches can be non-Boolean and can include both XOR and majority logic gates and spin-wave fabrics. Once the sets of architectures and applications have been identified, the fundamental physical mechanisms required for each architecture can be identified as well. For example, the range of material parameters for operation, such as exchange coupling strength, current density, etc can be identified.

FIGS. 24-26 show multiple memory architectures that can use skyrmions. All of the architectures in FIGS. 24-26 use a magnetic phase to encode information. A zero or a one can be encoded as a skyrmionic phase or a ferromagnetic phase, respectively. Writing a bit physically can correspond to transitioning between the two phases (skyrmionic to ferromagnetic and vice versa).

FIG. 24 illustrates a racetrack memory architecture 2400, according to examples of the present disclosure. Racetrack memory architecture 2400 comprises a helimagnetic material 2405 in the form of a wire, such as the helimagnetic material described in FIG. 2. Skyrmions 2420 can be created (written) and annihilated (erased) by writing unit 2410 and erasing unit 2415, respectively, using the process described in FIG. 2. A skyrmion can be written to or erased from an addressable memory location within the racetrack memory architecture 2400. Skyrmions 2420 can be moved along the racetrack memory architecture 2400 as indicted by arrows 2425 by a second current that is lower than the current used to create/annihilate the skyrmion. One advantage of the racetrack memory architecture 2400 is that the skyrmion array can be driven along the wire by significantly lower currents than domain walls. The skyrrnions can therefore more easily move around potential defects in the wire. This can provide a physical mechanism for robust, low-energy information flow.

FIG. 25a illustrates a nanomesh memory architecture 2500, according to examples of the present disclosure. Nanomesh memory architecture 2500 comprises a metal grid including horizontal metallic word lines 2505 and vertical metallic bit lines 2510. In some examples, the horizontal and vertical lines can be interchanged. In some examples, the metal grid can comprise a hard ferromagnetic material with in-plane polarized spin. A perspective view is shown in FIG. 25b. Helimagnetic material 2515, such as the helimagnetic material described in FIG. 2 including a B20 compound, can be formed and positioned at the intersection of the grid where skyrmions can be created (written) and annihilated (erased) by a writing unit (not shown) and an erasing unit (not shown), respectively, using the process described in FIG. 2. In some examples, the B20 compound can be replaced with a ferromagnetic material such as Fe and a bit line or word line can be used with strong spin orbit coupling to induce an interfacial skyrmion (Néel type) in the Fe at the interface. These types of skyrmions can exist at room temperature, and the thickness of the ferromagnetic layer can he extremely thin, on the order of a few nanometers, In some examples, an insulator can be optionally formed in the gap between the horizontal metallic word lines 2505 and the vertical metallic bit lines 2510. For example, injecting spin-polarized current from the bit line into the word line will 'write' a skyrmion at the interaction. The voltage is applied to one bit line, and only one word line is connected to ground, so that a particular intersection (bit) is uniquely chosen and written, Reversing the polarity will destroy the skyrmion changing the bit from a '1' to a '0'. Readout can exploit a magnetoresistance effect The resistance between the word line and the bit line will depend on the presence or absence of a skyrmion, A skyrmion can be written to or erased from an addressable memory location within the nanomesh memory architecture 2500. Skyrmions can be moved along the nanomesh memory architecture 2500 by a second current that is lower than the current used to create/annihilate the skyrmion. The nanomesh memory architecture 2500 can reduce the dimensionality of the skyrmion material from one-dimensional race tracks of FIG. 24 to zero-dimensional, nanodisks. In one example, creation and annihilation of skyrmions in nanodisks, such as MnSe nanodisks, can be accomplished using spin-polarized current. For example, in a 100 nm nanodisk, skyrmions is created by using 0.2 ns pulses of 100 µA current in the geometry of the nanomesh memory architecture 2500, the nanodisks can sit on top of metallic word lines that can supply the write or read current. Below the threshold current, the spins of the electrons passing through the skyrmion texture, can adiabatically conform to the local spin texture. Thus, the spin information contained In the skyrmion or ferromagnetic phase can be carried by the electron current into the bit line. Modifying the geometry to feed the spin information from two nanodisks into a receiving disk can result in the universal XOR logic gate. In some examples, by using electron spin as the interconnect, both memory and logic applications can be achieved.

FIG. 26 illustrates spin wave memory array 2600, according to examples of the present disclosure. The spin wave memory array 2600 can comprise a grid 2615 of a ferromagnetic insulator (FMI) such as YIG or an antiferromagnetic insulator (AFMI) such as NiO with low damping and long spin wave diffusion lengths. Spin waves 2620 are excited at the edges of the array at, for example, ports 2605 (ports 1-3) and detected at output ports 2610 (ports 7-9). The amplitude and phase of the spin waves 2620 at the output ports 2610 will depend on the spin texture at the intersection points. The presence or absence of skyrmions at the cross points encode the information, Sputtering a metal with large spin orbit coupling (SOC) on the intersection points will create an interfacial DM interaction that, wall support an interfacial Néel type skyrmion. Furthermore, the strength of the DM interaction can he modulated by a voltage applied to the SOC metal. The spin wave memory array can be non-Boolean. Reading can be performed by driving a current across a word line. When a skyrmion is present a topological Hall voltage can develop on the bit line. In one example, all of the bits on the world line can he read in parallel Writing to the spin wave memory array 2600 can be performed using vertical metal plugs through vias to the intersection points. A vertical current can drive the spin texture into and out of the skyrmion phase. This approach can be the most compatible with solid state electronics.

The above architectures can have both commonalities and differences of the skyrmionic properties. For example, all of the above architectures can require some form of skyrmion creation, storage, reading, and deletion. In one example, the write operation can require external control of the magnetic phase. In other examples, creation and annihilation can be demonstrated via control of the external magnetic field, circular current, and spin polarized current. Sweeping local magnetic fields can be difficult in highly scaled geometries, requiring high current densities for switching.

Multiple methods can be used to "read" a skyrmion. For example, in the racetrack memory architecture 2400, a standard GMR read-head approach can be used to differentiate between the skyrmion and the ferromagnetic phase. In the nanomesh memory architecture 2500 and the spin wave memory array 2600, the spin information of the lattice can be transferred to the electron current spin polarization which is then transferred to the interconnect. Additionally, the nanomesh architecture 2500 and the spin wave memory array 2600, the Hall voltage can he used to provide a readout. Furthermore, in the spin wave memory array 2600, different magnetic phases can alter the scattering matrix to give rise to multiple interference patterns.

While the teachings has been described with reference to the exemplary embodiments thereof, those skilled in the art will be able to make-various modifications to the described embodiments without departing from the true spirit and scope. The terms and descriptions used herein are set forth by way of illustration only and are not meant as limitations, in particular, although the method has been described by examples, the steps of the method may be performed in a different order than illustrated or simultaneously. Furthermore, to the extent that the terms "including", "includes", "having", "has", "with", or variants thereof are used in either the detailed description and the claims, such terms are intended to be inclusive in a manner similar to the term "comprising." As used herein, the term "one or more of" with respect to a listing of items such as, for example, A and B, means A alone, B alone, or A and B. Those skilled in the art will recognize that these and other variations are possible within the spirit and scope as defined In the following claims and their equivalents.

Other embodiments of the invention will be apparent to those skilled in the art from consideration of the specification and practice of the invention disclosed herein, it is intended that the specification and examples be considered as exemplary only, with a true scope and spirit of the invention being indicated by the following claims.

We claim:

1. A method for creating a skyrm ion, the method comprising:
providing a current through an electrode on a top surface of a helimagnetic material, wherein the current creates the skyrm ion on the top surface, wherein the electrode comprises a nanopillar electrode, wherein the nanopillar electrode is deposited on top surface of the helimagnetic material, the helimagnetic material having a contact on a bottom surface or a side surface to provide a current drain.

2. The method of claim 1, wherein the skyrmion is stabilized by applying a static upward magnetic field perpendicular to the helimagnetic material to maintain a ferromagnetic (FM) phase background.

3. The method of claim 1, further comprising forming a spacer layer over the top surface of the helimagnetic material to provide enhanced electrical properties for the current.

4. The method of claim 3, wherein the spacer layer comprises an electrically conductive material.

5. The method of claim 4, wherein the electrically conductive material comprises a non-magnetic materials with a thickness sufficient for magnetically decouple a top FM metal layer of the nanopillar electrode and the helimagnetic material.

6. The method of claim 1, wherein a top layer of the nanopillar electrode is comprised of ferromagnetic (FM) metals or alloys.

7. The method of claim 6, wherein the alloys comprise CoFeB, Co, Fe, CoPt, FePt, FePd, CoPd, or combination thereof.

8. The method of claim 1, wherein the skyrmion is annihilated by reversing a direction that the current is applied.

9. The method of claim 1, wherein the helimagnetic material is composed of a material selected from FeGe, MnSi, MnGe, $Fe_{1-x}Co_xSi$, CoZnMn, $Mn_2YZ$ Heusler alloy, $(FeCoRh)_2Mo_3N$, Fe/Ir film, Ta/CoFeB, Pt/Co/Ta, Pt/W/CoFeB, Pt/Ta/CoFeB or Ir/Co/Pt.

10. A method of writing data to a magnetic memory structure, the method comprising:
creating of a skyrmion by injecting a first current through a metallic nanopillar electrode, wherein the first current, either spin polarized or unpolarized, creates rotating magnetic field on a first side of a helimagnetic material, the helimagnetic material having a contact on a second side to provide a current drain, wherein the skyrm ion represents a computer-readable data; and applying a static upward magnetic field perpendicular to the helimagnetic material to maintain a ferromagnetic (FM) phase background to stabilize the skyrmion.

11. The method of claim 10, wherein the magnetic memory structure comprises a race track memory structure, a nanomesh memory structure, or a spin wave memory.

12. The method of claim 10, wherein the skyrmion is annihilated by reversing a direction that the first current is applied.

13. The method of claim 10, further comprising applying a second current to move the skyrmion in the magnetic memory structure.

14. The method of claim 10, wherein the helimagnetic material is composed of a material selected from FeGe, MnSi, MnGe, $Fe_{1-x}Co_xSi$, CoZnMn, $Mn_2YZ$ Heusler alloy, $(FeCoRh)_2Mo_3N$, Fe/Ir film, Ta/CoFeB, Pt/Co/Ta, Pt/W/CoFeB, Pt/Ta/CoFeB or Ir/Co/Pt.

15. The method of claim 10, wherein the first current is injected using a point contact directly touches a surface of the helimagnetic material.

16. The method of claim 10, wherein the helimagnetic material is about 1-3 nm in thickness.

17. A method for reading a skyrmion in a memory device, the method comprising:

providing a first current, smaller than a second current that created the skyrmion, through a nanopillar or point contact; and reading the skyrmion by a change of a magnetoresistance between the nanopillar or point contact and a back electrode.

18. The method of claim 17, further comprising providing a spin wave through a nanomesh, wherein a presence of the skyrmion modifies a scattering matrix of spin waves, wherein a change of a transition rate of the spin wave reflects the presence or absence of the skyrmion.

* * * * *